US012620356B2

(12) United States Patent
 Kim et al.

(10) Patent No.: US 12,620,356 B2
(45) Date of Patent: *May 5, 2026

(54) DISPLAY DEVICE

(71) Applicant: SAMSUNG DISPLAY CO., LTD.,
 Yongin-si (KR)

(72) Inventors: Il Nam Kim, Yongin-si (KR); Seung Hyun Moon, Yongin-si (KR); Dong Wook Yang, Yongin-si (KR); Hyun Dae Lee, Yongin-si (KR); Kang Bin Jo, Yongin-si (KR); Go Eun Cha, Yongin-si (KR); Hee Chul Hwang, Yongin-si (KR)

(73) Assignee: SAMSUNG DISPLAY CO., LTD.,
 Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/901,115

(22) Filed: Sep. 30, 2024

(65) Prior Publication Data

US 2025/0022308 A1 Jan. 16, 2025

Related U.S. Application Data

(63) Continuation of application No. 18/135,791, filed on Apr. 18, 2023, now Pat. No. 12,106,601.

(30) Foreign Application Priority Data

May 9, 2022 (KR) ........................ 10-2022-0056715

(51) Int. Cl.
 *G09G 3/3233* (2016.01)
 *G06V 40/13* (2022.01)
 *H10K 39/34* (2023.01)
 *H10K 59/131* (2023.01)

(52) U.S. Cl.
 CPC ....... *G09G 3/3233* (2013.01); *G06V 40/1318* (2022.01); *H10K 39/34* (2023.02);
 (Continued)

(58) Field of Classification Search
 CPC ............. G06V 40/1318; G09G 3/3233; G09G 2300/0819; G09G 2300/0842;
 (Continued)

(56) References Cited

U.S. PATENT DOCUMENTS

| 9,342,733 | B2 | 5/2016 | Lee et al. |
| 10,203,816 | B2 | 2/2019 | Nelson et al. |
| | | (Continued) | |

FOREIGN PATENT DOCUMENTS

| WO | 20200165686 | 8/2020 |

*Primary Examiner* — Premal R Patel
(74) *Attorney, Agent, or Firm* — F. CHAU & ASSOCIATES, LLC

(57) ABSTRACT

A display device including: scan lines including first and second scan lines; pixels connected to the scan lines; photo sensors connected to some of the scan lines, the photo sensors including a first photo sensor connected to the first scan line and a readout line, and a second photo sensor connected to the second scan line and the readout line; a scan driver to provide scan signals to the scan lines; and a readout circuit to receive, through the readout line, detection signals which are outputted from the photo sensors in response to the scan signals, wherein, while the scan signals are provided to the first and second scan lines, the readout circuit samples a detection signal of one of the first photo sensor and the second photo sensor without sampling a detection signal of the other one of the first photo sensor and the second photo sensor.

20 Claims, 21 Drawing Sheets

(52) U.S. Cl.
CPC ... *H10K 59/131* (2023.02); *G09G 2300/0819*
(2013.01); *G09G 2300/0842* (2013.01); *G09G*
*2300/0861* (2013.01); *G09G 2310/0202*
(2013.01); *G09G 2310/08* (2013.01); *G09G*
*2354/00* (2013.01); *G09G 2360/14* (2013.01)

(58) Field of Classification Search
CPC ... G09G 2300/0861; G09G 2310/0202; G09G
2310/08; G09G 2354/00; G09G 2360/14;
G09G 2310/0251; G09G 2310/0262;
G09G 2300/0452; G09G 2320/045; G09G
3/3225; G09G 3/32; G09G 2360/144;
G09G 3/3266; G09G 2300/0426; G09G
2300/0809; H10K 39/34; H10K 59/131;
H10K 59/13; G06F 3/041
See application file for complete search history.

(56) References Cited

U.S. PATENT DOCUMENTS

| 10,437,974 | B2 | 10/2019 | He et al. | |
|---|---|---|---|---|
| 2012/0056835 | A1 | 3/2012 | Choo et al. | |
| 2013/0257833 | A1 | 10/2013 | Kim | |
| 2018/0341357 | A1 | 11/2018 | Son et al. | |
| 2019/0204989 | A1* | 7/2019 | Shin | G06F 3/0412 |
| 2020/0159385 | A1* | 5/2020 | Chung | G06F 3/042 |
| 2020/0192522 | A1 | 6/2020 | Reynolds | |
| 2020/0357324 | A1 | 11/2020 | Park et al. | |
| 2020/0365099 | A1 | 11/2020 | Lius et al. | |
| 2021/0066669 | A1 | 3/2021 | Kubota et al. | |
| 2022/0165083 | A1* | 5/2022 | Lin | G06F 3/04184 |
| 2022/0173174 | A1 | 6/2022 | Hatsumi et al. | |
| 2023/0360427 | A1 | 11/2023 | Kim et al. | |

* cited by examiner

| R1 | | R2 | | R3 | | R4 | |
|---|---|---|---|---|---|---|---|
| SC 14 | | SC 24 | | SC 34 | | SC 44 | |
| PXC18 | | PXC28 | | PXC38 | | PXC48 | |
| PXC17 | | PXC27 | | PXC37 | | PXC47 | |
| SC 13 | | SC 23 | | SC 33 | | SC 43 | |
| PXC16 | | PXC26 | | PXC36 | | PXC46 | |
| PXC15 | | PXC25 | | PXC35 | | PXC45 | |
| SC 12 | | SC 22 | | SC 32 | | SC 42 | |
| PXC14 | | PXC24 | | PXC34 | | PXC44 | |
| PXC13 | | PXC23 | | PXC33 | | PXC43 | |
| SC 11 | | SC 21 | | SC 31 | | SC 41 | |
| PXC12 | | PXC22 | | PXC32 | | PXC42 | |
| PXC11 | | PXC21 | | PXC31 | | PXC41 | |

| R1 | R2 | R3 | R4 |
|---|---|---|---|
| PXC11 | PXC21 | PXC31 | PXC41 |
| PXC12 | PXC22 | PXC32 | PXC42 |
| DSC 11 | SC 11 | DSC 21 | SC 21 |
| PXC13 | PXC23 | PXC33 | PXC43 |
| PXC14 | PXC24 | PXC34 | PXC44 |
| PXC15 | PXC25 | PXC35 | PXC45 |
| PXC16 | PXC26 | PXC36 | PXC46 |
| DSC 12 | SC 12 | DSC 22 | SC 22 |
| PXC17 | PXC27 | PXC37 | PXC47 |
| PXC18 | PXC28 | PXC38 | PXC48 |

AS

DR1

DR2

DISPLAY DEVICE

CROSS-REFERENCE TO RELATED APPLICATION

The present application is a continuation of U.S. patent application Ser. No. 18/135,791 filed on Apr. 18, 2023 (now U.S. Pat. No. 12,106,601 issued Oct. 1, 2024), which claims priority under 35 U.S.C. § 119 to Korean patent application number 10-2022-0056715 filed on May 9, 2022, the disclosures of which are incorporated by reference herein in their entireties.

TECHNICAL FIELD

Various embodiments of the present disclosure relate to a display device.

DESCRIPTION OF RELATED ART

As information-oriented societies develop, applications for display devices continue to increase. For example, display devices have been applied to various electronic devices such as smartphones, digital cameras, notebook computers, navigation devices, and smart televisions.

Biometric sensors for sensing fingerprints or the like have been integrated into a display panel of a display device. Research is being conducted on how to better incorporate these sensors into a display device.

SUMMARY

To reduce the production cost and prevent degradation in resolution, scan lines for scanning pixels and sensors in a display panel may be shared.

However, due to an increase in surface area of the display panel and a high-frequency operation of the display device, the time it takes to scan each of the scan lines may be reduced, and the time (e.g., an individual readout time) it takes to read out a sensing signal from each of the sensors may be reduced. As a consequence, a sensing sensitivity of the sensors may be reduced.

Various embodiments of the present disclosure are directed to a display device in which pixels and sensors may share scan lines, and to a display device in which a sufficient readout time can be secured.

A display device in accordance with an embodiment of the present disclosure may include: scan lines including a first scan line and a second scan line which are adjacent to each other; pixels connected to the scan lines; photo sensors connected to at least some of the scan lines, the photo sensors including a first photo sensor connected to the first scan line and a readout line, and a second photo sensor connected to the second scan line and the readout line; a scan driver configured to provide scan signals to the scan lines; and a readout circuit configured to receive, through the readout line, detection signals which are outputted from the photo sensors in response to the scan signals, wherein, while the scan signals are provided to the first and second scan lines, the readout circuit samples a detection signal of one of the first photo sensor and the second photo sensor without sampling a detection signal of the other one of the first photo sensor and the second photo sensor.

The readout circuit may receive the detection signals during a plurality of frame periods, and the readout circuit may receive a detection signal from the first photo sensor during a first frame period, and receives a detection signal from the second photo sensor during a second frame period.

The scan lines may further include a third scan line and a fourth scan line, the photo sensors may further include a third photo sensor connected to the third scan line, and a fourth photo sensor connected to the fourth scan line, and the readout circuit may sample a detection signal of only one of the first, second, third, and fourth photo sensors while the scan signals are provided to the first, second, third, and fourth scan lines.

The readout circuit may sample a detection signal of the first photo sensor during a first frame period, sample a detection signal of the second photo sensor during a second frame period, sample a detection signal of the third photo sensor during a third frame period, and sample a detection signal of the fourth photo sensor during a fourth frame period.

The readout circuit may include: an integrating circuit configured to integrate a signal flowing through the readout line; a first sampling circuit configured to sample an output of the integrating circuit and generate a first sampling signal; a second sampling circuit configured to sample the output of the integrating circuit and generate a second sampling signal; and an analog-digital converter configured to output a digital value corresponding to a difference between the first sampling signal and the second sampling signal.

During a first period in which a scan signal is applied to the first scan line, the integrating circuit and the readout line may be reset, in a second period between the first period and a third period in which a scan signal is applied to the second scan line, the first sampling circuit may generate the first sampling signal, and in the third period, the second sampling circuit may generate the second sampling signal.

The third period may be greater than the second period, and the first period may be greater than the third period.

The second sampling circuit may generate the second sampling signal in response to a sampling control signal, and a pulse width of the sampling control signal may be greater than a pulse width of the scan signal applied to the first scan line.

The integrating circuit and the readout line may remain reset while scan signals are applied to at least two scan lines among the scan lines.

One of the pixels may include: a light emitting element; a first transistor configured to control a driving current flowing through the light emitting element in response to a voltage of a first node; and a second transistor configured to transmit a data signal to the first node in response to a scan signal provided to the first scan line, the first photo sensor may include: a light receiving element; a first sensor transistor configured to control a current flowing to the readout line in response to a voltage of one electrode of the light receiving element; a second sensor transistor electrically connected between the first sensor transistor and the readout line, and including a gate electrode connected to the first scan line; and a third sensor transistor electrically connected between a reference power line and the one electrode of the light receiving element, and including a gate electrode connected to a reset control line.

The reset control line may be connected in common to the first photo sensor and the second photo sensor.

A circuit layer including the first and second transistors and the first, second, and third sensor transistors may be disposed on a substrate, and the light emitting element and the light receiving element may be disposed on the circuit layer.

The readout circuit ma sample the detection signals during a plurality of frame periods, and with respect to a vertical synchronization signal defining a start of each of the frame periods, a time point at which the sampling is first performed may be changed in each of the frame periods.

The readout circuit may sample the detection signals during a plurality of frame periods, and with respect to a vertical synchronization signal defining a start of each of the frame periods, a time point at which the sampling is performed may be identical in the frame periods, and a time point at which a first scan signal among the scan signals is applied may be changed in each of the frame periods.

The scan lines may be horizontal lines, and the photo sensors may be disposed on respective horizontal lines.

The pixels may include a first pixel, a second pixel, a third pixel, and a fourth pixel which are adjacent to each other in a plan view, the first pixel may emit a first color of light, the second pixel and the fourth pixel may emit a second color of light, the third pixel may emit a third color of light, and in a plan view, the photo sensor may be disposed between the second pixel and the third pixel or between the second pixel and the first pixel.

The photo sensors may be connected to only some of the scan lines, and are disposed over at least two scan lines among the scan lines.

A display device according to an embodiment of the present disclosure may include: pixels connected to scan lines; photo sensors connected to at least some of the scan lines; a scan driver configured to provide scan signals to the scan lines; and a readout circuit configured to receive, through a readout line, detection signals which are outputted from the photo sensors in response to at least some of the scan signals, wherein, with respect to a vertical synchronization signal defining each of a plurality of frame periods, a time point at which a scan signal is applied to a first scan line among the scan lines is changed in each of the frame periods.

With respect to the vertical synchronization signal, time points at which the detection signals are sampled in the readout circuit may be constant in each of the frame periods.

The readout circuit may sample the detection signals in first, second, third, and fourth frame periods, and the first, second, third, and fourth frame periods may differ from each other in the time point at which the scan signal is applied to the first scan line.

A display device according to an embodiment of the present disclosure may include: photo sensors connected to scan lines and a readout line; a scan driver configured to provide scan signals to the scan lines; and a readout circuit configured to receive, through the readout line, detection signals which are outputted from the photo sensors, wherein the readout circuit samples a detection signal of only one of the photo sensors while the scan signals are provided to the scan lines.

BRIEF DESCRIPTION OF THE DRAWINGS

FIG. 1 is a block diagram illustrating a display device in accordance with embodiments of the present disclosure.

FIG. 3 is a diagram illustrating an example arrangement of backplane circuits of a display area of a display panel included in the display device of FIG. 2.

FIGS. 12 and 13 are views for describing an embodiment of the operation of the readout circuit of FIG. 8.

FIG. 17 is a diagram illustrating an example arrangement of backplane circuits of the display area of the display panel included in the display device of FIG. 2.

DETAILED DESCRIPTION OF THE EMBODIMENTS

Figure 2:
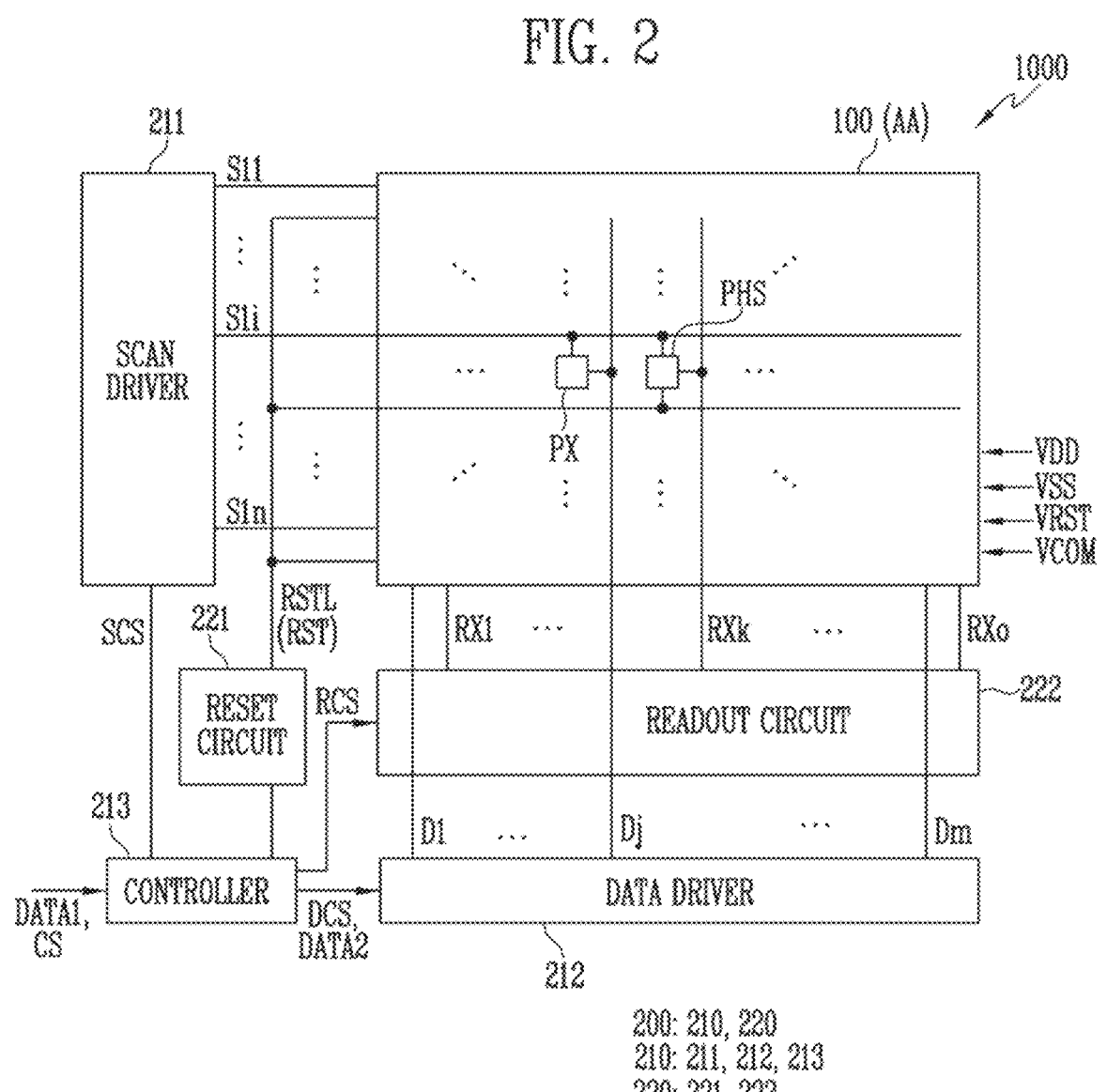
FIG. 2 is a block diagram illustrating an embodiment of the display device of FIG. 1.

Reference will now be made in detail to various embodiments of the present disclosure. For example, specific examples of the embodiments are illustrated in the accompanying drawings and described below; however, the embodiments can be modified in many different ways.

Some embodiments are described in the accompanying drawings in connection with functional blocks, units and/or modules. Those skilled in the art will understand that such blocks, units, and/or modules are physically implemented by logic circuits, discrete components, microprocessors, hardwired circuits, memory elements, line connections, and other electronic circuits. These elements may be formed using semiconductor-based fabrication techniques or other fabrication techniques. For blocks, units, and/or modules implemented by a microprocessor or other similar hardware, they may be programmed and controlled using software to perform various functions discussed herein, and may be optionally driven by firmware and/or software. In addition, each block, unit, and/or module may be implemented by dedicated hardware, or be implemented by a combination of the dedicated hardware which performs some functions and a processor which performs different functions (e.g., one or more programmed microprocessors and related circuits). Furthermore, in some embodiments, the blocks, units and/or modules may be physically separated into two or more individual blocks, units and/or modules which interact with each other. In some embodiments, the blocks, units and/or modules may be physically combined into more complex blocks, units and/or modules.

Each embodiment to be described below may be implemented alone, or combined with at least another embodiment to make various combinations of embodiments.

Some elements which are not directly related to the features of the present disclosure in the drawings may be omitted to more clearly explain the present disclosure. Furthermore, the sizes, ratios, etc. of some elements in the drawings may be slightly exaggerated. It should be noted that the same reference numerals may be used to designate the same or similar elements throughout the drawings, and repetitive explanations may be omitted.

Figure 1:
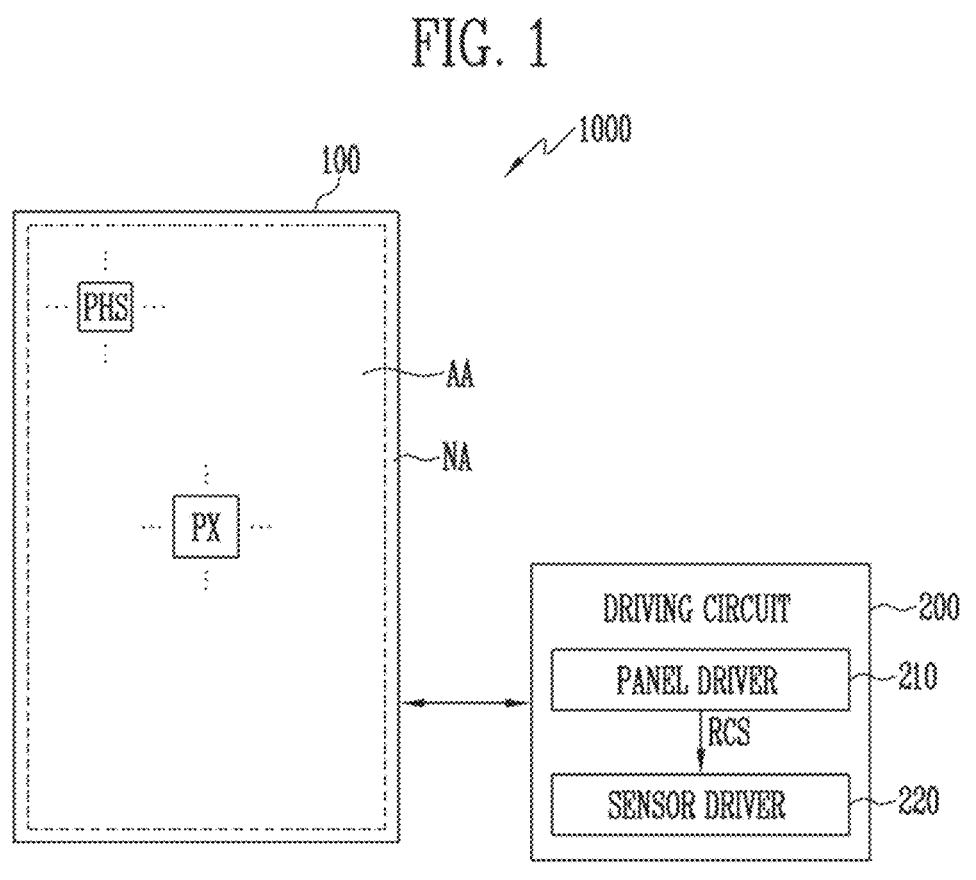

FIG. 1 is a block diagram illustrating a display device 1000 in accordance with embodiments of the present disclosure.

Referring to FIG. 1, the display device 1000 may include a display panel 100 and a driving circuit 200. In an embodiment, the driving circuit 200 may include a panel driver 210 and a sensor driver 220.

The display device 1000 may be a self-emissive display device including a plurality of self-emissive elements. Particularly, the display device 1000 may be an organic light emitting display device including organic light emitting elements. However, this is merely an example, and the display device 1000 may be a display device including inorganic light emitting elements, a display device including light emitting elements formed of a combination of an inorganic material and an organic material, a display device which uses quantum dots to display an image, or the like.

The display device 1000 may be a flat display device, a flexible display device, a curved display device, a foldable display device, a bendable display device, or a rollable display device. Furthermore, the display device 1000 may be applied to a transparent display device, a head-mounted display device, a wearable display device, or the like.

The display panel 100 includes a display area AA and a non-display area NA. The display area AA may be an area in which a pixel PX is provided. The pixel PX may be referred to as a sub-pixel or a light emitting pixel. The pixel PX may include at least one light emitting element. For example, the light emitting element may include a light emitting layer (e.g., an organic light emitting layer). An area where light is emitted by the light emitting element may be referred to as a light emitting area. The display device 1000 may drive the pixel PX in response to image data, thus displaying an image on the display area AA.

The non-display area NA may be an area provided around the display area AA. In an embodiment, the non-display area NA may collectively refer to an area of the display panel 100 other than the display area AA. For example, the non-display area NA may include a line area, a pad area, and various dummy areas.

In an embodiment, a photo sensor PHS may be included in the display area AA. The photo sensor PHS may be referred to as a sensor pixel. The photo sensor PHS may include a light receiving element including a light receiving layer. The light receiving layer of the light receiving element in the display area AA may be spaced apart from the light emitting layer of the light emitting element.

In an embodiment, a plurality of photo sensors PHS may be distributed at positions spaced apart from each other throughout the display area AA. However, this is merely an example, and only a portion of the display area AA may be set to a sensing area, and the photo sensors PHS may be provided in the sensing area. Furthermore, a photo sensor PHS may also be included in at least a portion of the non-display area NA.

In an embodiment, the photo sensor PHS may sense that light emitted from a light source (e.g., a light emitting element of the pixel PX) is reflected by an external object (e.g., the finger of a user). For example, the fingerprint of the user may be sensed by the photo sensor PHS. Although hereinafter the photo sensor PHS will be described as being used for fingerprint sensing by way of example, the photo sensor PHS may sense various types of biometric information such as iris information or vein information.

The driving circuit 200 may include the panel driver 210 and the sensor driver 220. The display device 1000 may include the panel driver 210 and the sensor driver 220. For example, the panel driver 210 and the sensor driver 220 may be implemented as integrated circuits independent from each other, or the driving circuit 200 may be implemented as a single integrated circuit. For instance, at least a portion of the senor driver 220 may be included in the panel driver 210 or interlock with the panel driver 210.

The panel driver 210 may scan the pixel PX of the display area AA, and supply a data signal corresponding to image data (or an image) to the pixel PX. The display panel 100 may display an image corresponding to the data signal.

In an embodiment, the panel driver 210 may supply a driving signal for light sensing (e.g., fingerprint sensing) to the pixel PX. The driving signal may be provided to cause the pixel PX to emit light and operate as a light source for the photo sensor PHS. In an embodiment, the panel driver 210 may also supply the driving signal and/or another driving signal for light sensing to the photo sensor PHS. However, this is merely an example, and driving signals for light sensing may be provided by the sensor driver 220.

The sensor driver 220 may detect biometric information related to the fingerprint of the user or the like, based on a sensing signal received from the photo sensor PHS. In an embodiment, the sensor driver 220 may supply the driving signals to the photo sensor PHS and/or the pixel PX.

In an embodiment, the panel driver 210 may provide a readout control signal RCS to the sensor driver 220. Interlocking with the panel driver 210, the sensor driver 220 may read out (or sample) a sensing signal, based on the readout control signal RCS. For example, the sensor driver 220 may read out or sample the sensing signal in the unit of at least one pixel row (or a horizontal line) in response to the readout control signal RCS.

FIG. 2 is a block diagram illustrating an embodiment of the display device 1000 of FIG. 1.

Referring to FIGS. 1 and 2, the display panel 100 may include signal lines, a pixel PX, and a photo sensor PHS. The signal lines may include first scan lines S11 to S1n, data lines D1 to Dm, readout lines RX1 to RXo, and a reset control line RSTL (or a reset line). Here, n, m, and o may each be a natural number.

The pixel PX may be disposed or located in an area (e.g., a pixel area) defined by the first scan lines S11 to Sin and the data lines D1 to Dm. The photo sensor PHS may be disposed or located in an area defined by the first scan lines S11 to Sin and the readout lines RX1 to RXo. The pixel PX and the photo sensor PHS may be arranged in a two-dimensional array in the display area AA of the display panel 100, but the present disclosure is not limited thereto.

The pixel PX may be electrically connected to at least one of the first scan lines S11 to Sin and one of the data lines D1 to Dm. The photo sensor PHS may be electrically connected to one of the first scan lines S11 to Sin, one of the readout lines RX1 to RXo, and the reset control line RSTL. The connection configuration between the pixel PX, the photo sensor PHS, and the signal lines will be described below with reference to FIG. 5.

Power voltages VDD, VSS, VRST, and VCOM used to drive the pixel PX and the photo sensor PHS may be provided to the display panel 100. The power voltages VDD, VSS, VRST, and VCOM may be provided from a power supply. The power supply may be implemented as a power management integrated circuit (PMIC).

The driving circuit 200 may include a scan driver 211 (or a gate driver), a data driver 212 (or a source driver), a controller 213 (or a timing controller), a reset circuit 221 (or a resetting component), and a readout circuit 222 (or a readout component). For example, the scan driver 211, the data driver 212, and the controller 213 may be included in the panel driver 210. The reset circuit 221 and the readout circuit 222 may be included in the sensor driver 220. However, the present disclosure is not limited thereto. For example, the reset circuit 221 may be included in the panel driver 210.

The scan driver 211 may be electrically connected to the pixel PX and the photo sensor PHS by the first scan lines S11 to Sin (or the scan lines). The scan driver 211 may generate first scan signals (or scan signals) based on a scan control signal SCS (or a gate control signal), and provide the first scan signals to the first scan lines S11 to Sin (or the scan lines). Here, the scan control signal SCS may include a start signal, clock signals, and the like, and may be provided from the controller 213 to the scan driver 211. For example, the scan driver 211 may be a shift register configured to successively shift a pulse-type start signal based on the clock signals and generate and output the first scan signals. In other words, the scan driver 211 may scan the display panel 100, and selectively drive the pixel PX and the photo sensor PHS.

The scan driver 211 along with the pixel PX may be formed in the display panel 100. However, the scan driver 211 is not limited thereto. For example, the scan driver 211 may be implemented as an integrated circuit.

The pixel PX that is selected and driven by the scan driver 211 may emit light at a luminance corresponding to a data signal provided from a corresponding data line. The photo sensor PHS that is selected and driven by the scan driver 211 may output, to a corresponding readout line, an electrical signal (e.g., a sensing signal, for example, current/voltage) corresponding to sensed light. For example, the pixel PX that is selected and driven through an i-th first scan line S1$i$ may emit light at a luminance corresponding to a data signal provided to a j-th data line Dj (here, i and j each are a natural number). In addition, the photo sensor PHS that is selected and driven through the i-th first scan line S1$i$ may output, to a k-th readout line RXk (here, k is a natural number), an electrical signal corresponding to the sensed light.

The data driver 212 may generate a data signal (or a data voltage) based on image data DATA2 and a data control signal DCS that are provided from the controller 213, and provide the data signal to the display panel 100 (or the pixel PX) through the data lines D1 to Dm. Here, the data control signal DCS may be a signal for controlling the operation of the data driver 212, and include a data enable signal (or a load signal) for instructing the data driver 212 to output a valid data signal, a horizontal start signal, a data clock signal, and the like. For example, the data driver 212 may include a shift register configured to shift a horizontal start signal in synchronization with the data clock signal and generate a sampling signal, a latch configured to latch the image data DATA2 in response to the sampling signal, a digital-analog converter (or a decoder) configured to convert the latched image data (e.g., digital data) to an analog data signal, and a buffer (or an amplifier) configured to output the data signal to the data line (e.g., the j-th data line Dj).

The controller 213 may receive input image data DATA1 and a control signal CS from an external device (e.g., a graphic processor, or an application processor), generate the scan control signal SCS and the data control signal DCS based on the control signal CS, and generate the image data DATA2 by converting the input image data DATA1. Here, the control signal CS may include a vertical synchronization signal, a horizontal synchronization signal, a reference clock signal, and the like. The vertical synchronization signal may refer to a start of frame data (e.g., data corresponding to a frame period in which one frame image is displayed). The horizontal synchronization signal may refer to a start of a data row (e.g., one data row among a plurality of data rows included in the frame data). For example, the controller 213 may convert the input image data DATA1 to the image data DATA2 having a format corresponding to pixel arrangement in the display panel 100.

Furthermore, the controller 213 may generate a reset control signal and a readout control signal RCS, based on the control signal CS.

The reset circuit 221 may be connected in common to all photo sensors PHS provided in the display panel 100 through one reset control line RSTL. The reset circuit 221 may simultaneously provide a reset signal RST to all of the photo sensors PHS in response to the reset control signal provided from the controller 213. Here, the reset signal RST may be a control signal for providing a reset voltage VRST to the photo sensors PHS. Because the reset signal RST is simultaneously provided to all of the photo sensor PHS, the reset signal RST may be referred to as a global reset signal.

The readout circuit 222 may receive sensing signals from the photo sensors PHS through the readout lines RX1 to RXo, and perform a signal processing operation for the sensing signals.

For example, the readout circuit 222 may perform a correlated double sampling (CDS) operation to remove noise from the sensing signals provided from the photo sensors PHS. The readout circuit 222 may perform the CDS operation in response to the readout control signal RCS. In other words, a timing of the CDS operation of the readout circuit 222 may be determined by the readout control signal RCS. Furthermore, the readout circuit 222 may convert an analog sensing signal to a digital signal (or a digital value). The configuration for the CDS operation and the analog-digital conversion may be provided for each of the readout lines RX1 to RXo. The readout circuit 222 may process in parallel the sensing signals provided from the readout lines RX1 to RXo.

The processed sensing signals, e.g., the readout sensing signal, may be provided to an external device (e.g., an application processor) as a piece of sensing data (or biometric information), so that a biometric authentication operation (e.g., a fingerprint authentication operation) may be performed based on the sensing data. On the other hand, the readout sensing signals may be provided to the controller 213, so that a biometric authentication operation may be performed by the controller 213.

Figure 4:
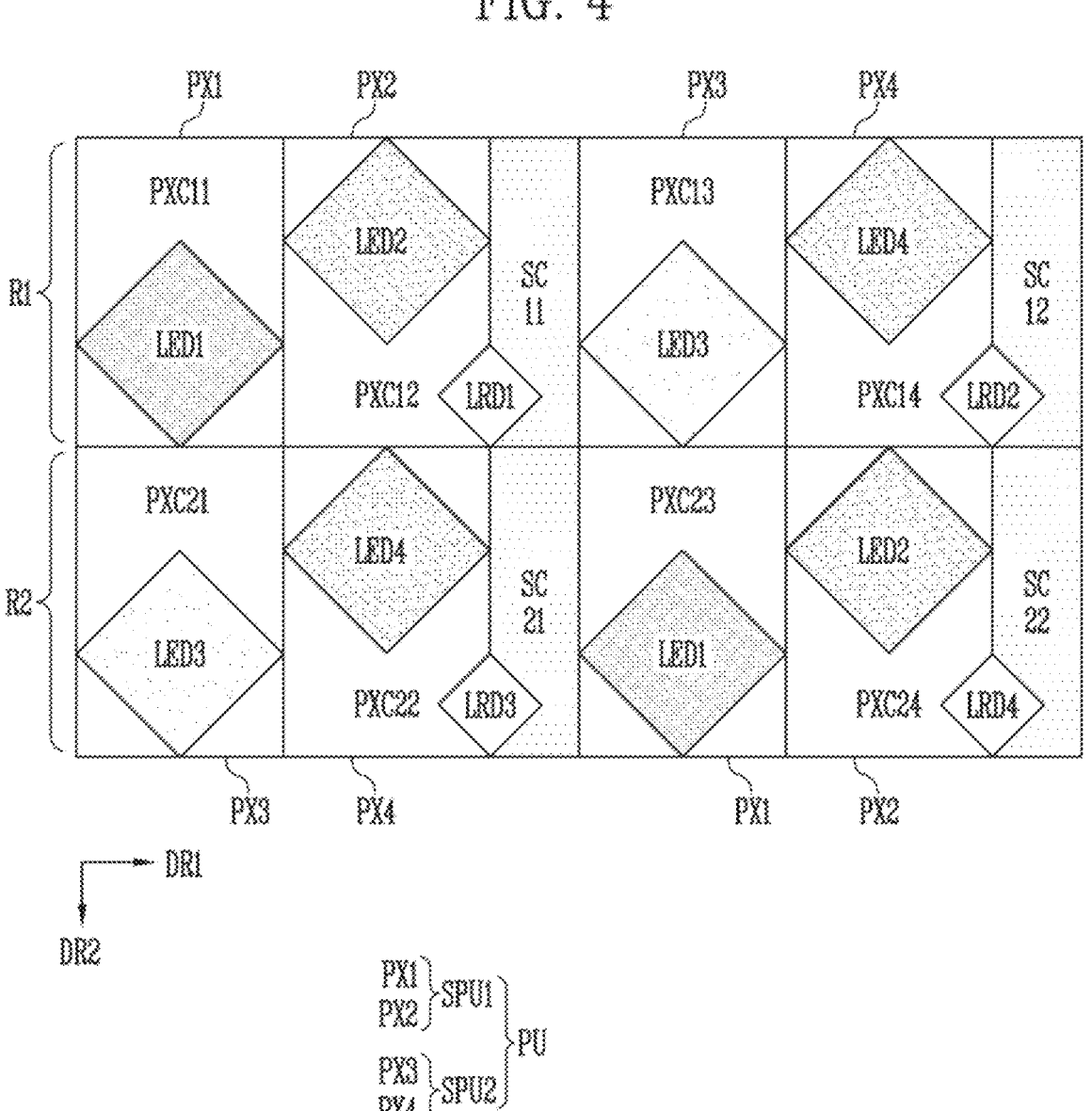
FIG. 4 is a diagram illustrating an example of the display area of the display panel included in the display device of FIG. 2.

FIG. 3 is a diagram illustrating an example arrangement of backplane circuits of the display area AA of the display panel 100 included in the display device 1000 of FIG. 2. FIG. 4 is a diagram illustrating an example of the display area AA of the display panel 100 included in the display device 1000 of FIG. 2.

Referring to FIGS. 1 to 4, a plurality of pixels PX1, PX2, PX3, and PX4 and a plurality of photo sensors PHS may be disposed in the display area AA of the display panel 100.

The display area AA may be divided into a plurality of pixel rows R1 to R4. Each of the pixel rows R1 to R4 may extend in a first direction DR1 and may be arranged in a second direction DR2. Each of the pixel rows R1 to R4 may include pixels PX1, PX2, PX3, and PX4. Each of the pixels PX1, PX2, PX3, and PX4 may include one of pixel circuits PXC11 to PXC48 and one of light emitting elements LED1 to LED4. For example, the pixel row PX1 may include pixel circuits PXC11 to PXC18 and the pixel row PX2 may include pixel circuits PXC21 to PXC28

In an embodiment, the first pixel PX1, the second pixel PX2, and the third pixel PX3 may respectively emit first color light, second color light, and third color light. The first color light, the second color light, and the third color light may be different colors of light, and each may be one of red light, green light, and blue light. In an embodiment, the fourth pixel PX4 may emit the same color of light as that of the second pixel PX2. For example, the first light emitting element LED1 may emit the first color light. The second light emitting element LED2 and the fourth light emitting element LED4 may emit the second color light. The third light emitting element LED3 may emit the third color light.

In FIG. 4, it can be understood that each of the first to fourth light emitting elements LED1 to LED4 is a light emitting area corresponding to the light emitting layer. However, this is only for convenience of explanation, and the color of light emitted from each of the first to fourth light emitting elements LED1 to LED4, and the position, the surface area, the shape, and the like of each of the first to fourth light emitting elements LED1 to LED4 are not limited thereto.

In an embodiment, on each of odd-numbered pixel rows including a first pixel row R1 (or a first horizontal line) and a third pixel row R3 (or a third horizontal line), the pixels PX1, PX2, PX3, and PX4 may be arranged in the first direction DR1 in a sequence of the first pixel PX1 configured to emit red light, the second pixel PX2 configured to emit green light, the third pixel PX3 configured to emit blue light, and the fourth pixel PX4 configured to emit green light.

On each of even-numbered pixel rows including a second pixel row R2 (or a second horizontal line) and a fourth pixel row R4 (or a fourth horizontal line), the pixels PX1, PX2, PX3, and PX4 may be arranged in the first direction DR1 in a sequence of the third pixel PX3 configured to emit blue light, the fourth pixel PX4 configured to emit green light, the first pixel PX1 configured to emit red light, and the second pixel PX2 configured to emit green light.

In an embodiment, the first pixel PX1 and the second pixel PX2 may form a first sub-pixel unit SPU1. The third pixel PX3 and the fourth pixel PX4 may form a second sub-pixel unit SPU2. Therefore, on each of the odd-numbered pixel rows R1 and R3, the first sub-pixel units SPU1 and the second sub-pixel units SPU2 may be alternately disposed. On each of the even-numbered pixel rows R2 and R4, the second sub-pixel units SPU2 and the first sub-pixel units SPU1 may be alternately disposed in a pattern opposite to that of the odd-numbered pixel rows R1 and R3.

It can be understood that the first and second sub-pixel units SPU1 and SPU2 that are adjacent to each other include the first to fourth pixels PX1 to PX4 and form one pixel unit PU, for convenience of explanation. For example, FIG. 4 illustrates the pixel unit PU of each of the first pixel row R1 and the second pixel row R2.

However, this is only for illustrative purposes, and the arrangement of the pixels is not limited thereto.

On the first pixel row R1, the pixel circuits PXC11 to PXC18 which respectively correspond to the pixels PX1, PX2, PX3, and PX4 of the first pixel row R1 may be arranged in the first direction DR1. On the second pixel row R2, the pixel circuits PXC21 to PXC28 which respectively correspond to the pixels PX1, PX2, PX3, and PX4 of the second pixel row R2 may be arranged in the first direction DR1. Likewise, on each of the third and fourth pixel rows R3 and R4, the pixel circuits PXC31 to PXC38 and PXC41 to PXC48 which respectively correspond to the pixels PX1, PX2, PX3, and PX4 of the third and fourth pixel rows R3 and R4 may be arranged in the first direction DR1.

In FIG. 3, the first to fourth pixel circuits PXC11 to PXC14 of the first pixel row R1 may be included in one pixel unit PU, and the fifth to eighth pixel circuits PXC15 to PXC18 of the first pixel row R1 may be included in another pixel unit PU.

Likewise, the first to fourth pixel circuits PXC21 to PXC24 of the second pixel row R2, the fifth to eighth pixel circuits PXC25 to PXC28 of the second pixel row R2, the first to fourth pixel circuits PXC31 to PXC34 of the third pixel row R3, the fifth to eighth pixel circuits PXC35 to PXC38 of the third pixel row R3, the first to fourth pixel circuits PXC41 to PXC44 of the fourth pixel row R4, and the fifth to eighth pixel circuits PXC45 to PXC48 of the fourth pixel row R4 may also be included in respective different pixel units PU.

In an embodiment, each of the pixel rows R1 to R4 may include light receiving elements LRD1 to LRD4. In FIG. 3, it can be understood that each of the first to fourth light receiving elements LRD1 to LRD4 is a light receiving area corresponding to the light receiving layer. However, this is merely an example, and the positions, the surface areas, the shapes, or the like of the first to fourth light receiving elements LRD1 to LRD4 are not limited thereto.

The light receiving elements LRD1 and LRD2 of the first pixel row R1 each may overlap at least some of the pixel circuits PXC11 to PXC14 of the first pixel row R1 and sensor circuits SC11 and SC12 of the first pixel row R1. The light receiving elements LRD3 and LRD4 of the second pixel row R2 each may overlap at least some of the pixel circuits PXC21 to PXC24 of the second pixel row R2 and sensor circuits SC21 and SC22 of the second pixel row R2.

In an embodiment, the first light receiving element LRD1 may overlap at least a portion of the first sensor circuit SC11 of the first pixel row R1 and at least a portion of the pixel circuit PXC12 of the first pixel row R1. The third light receiving element LRD3 may overlap at least a portion of the first sensor circuit SC21 of the second pixel row R2 and at least a portion of the pixel circuit PXC22 of the second pixel row R2.

Furthermore, referring to FIGS. 3 and 4, the second light receiving element LRD2 may overlap at least a portion of the second sensor circuit SC12 of the first pixel row R1 and at least a portion of the pixel circuit PXC14 of the first pixel row R1. The fourth light receiving element LRD4 may overlap at least a portion of the second sensor circuit SC22 of the second pixel row R2 and at least a portion of the pixel circuit PXC24 of the second pixel row R2.

The first to fourth light receiving elements LRD1 to LRD4 may be formed in the display area AA in an arrangement as shown in FIG. 4.

In an embodiment, the sensor circuits SC11 to SC44 may be connected to corresponding light receiving elements. For example, the first sensor circuit SC11 of the first pixel row R1 may be connected to the first light receiving element LRD1. The first sensor circuit SC11 and the first light receiving element LRD1 may form one photo sensor PHS. Likewise, the second sensor circuit SC12 of the first pixel row R1 may be connected to the second light receiving element LRD2. The second sensor circuit SC12 and the second light receiving element LRD2 may form one photo sensor PHS. The first sensor circuit SC21 of the second pixel row R2 may be connected to the third light receiving element LRD3. The first sensor circuit SC21 and the third light receiving element LRD3 may form one photo sensor PHS. The second sensor circuit SC22 of the second pixel row R2 may be connected to the fourth light receiving element LRD4. The second sensor circuit SC22 and the fourth light receiving element LRD4 may form one photo sensor PHS. The present disclosure is not limited thereto. For example, only some of the sensor circuits SC11 to SC44 may be provided and connected to a plurality of light receiving elements. This will be described below with reference to FIGS. 17 and 18.

The first sensor circuit SC11 of the first pixel row R1 may be disposed between the first sub-pixel unit SPU1 and the second sub-pixel unit SPU2 included in the pixel unit PU. For example, the first and second pixel circuits PXC11 and PXC12 of the first pixel row R1 may be included in the first sub-pixel unit SPU1. The third and fourth pixel circuits PXC13 and PXC14 of the first pixel row R1 may be included in the second sub-pixel unit SPU2. Therefore, at least two pixel circuits (e.g., PXC13 and PXC14) may be disposed between the first sensor circuit SC11 and the second sensor circuit SC12 which are adjacent to each other on the first pixel row R1.

The second sensor circuit SC12 of the first pixel row R1, the first sensor circuit SC21 of the second pixel row R2, and the second sensor circuit SC22 of the second pixel row R2 may be disposed between first and seconds sub-pixel units in a manner similar to that of the first sensor circuit SC11 of the first pixel row R1.

Figure 5:
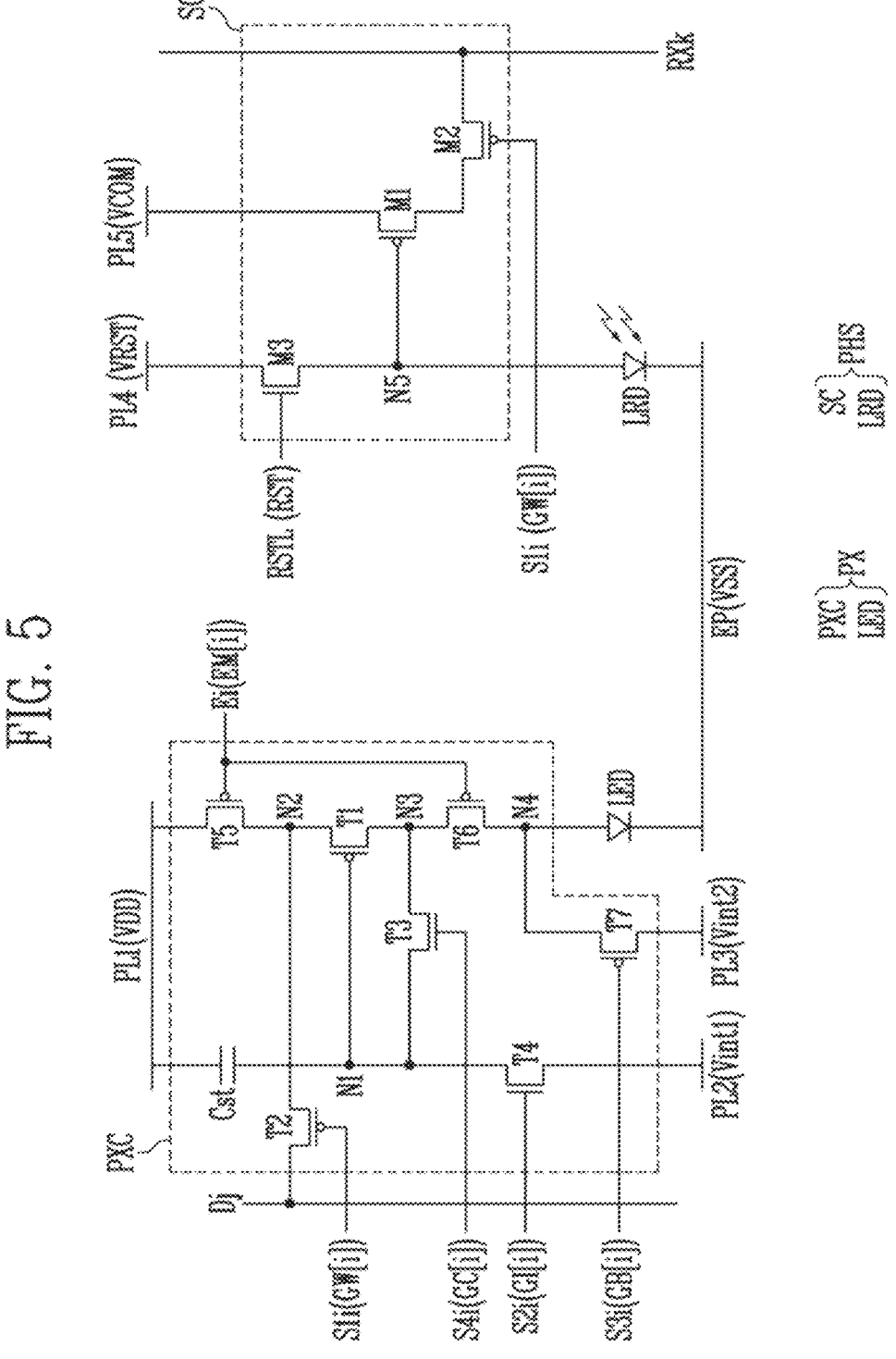
FIG. 5 is a circuit diagram illustrating an example of a pixel and a photo sensor which are included in the display area of FIG. 4.

FIG. 5 is a circuit diagram illustrating an example of the pixel PX and the photo sensor PHS which are included in the display area AA of FIG. 4. For convenience of description, FIG. 5 illustrates the pixel PX that is located on the i-th horizontal line (or the i-th pixel row) and connected to the j-th data line Dj.

Referring to FIGS. 1 to 5, the pixel PX and the sensor circuit SC may be disposed on the i-th horizontal line.

The pixel PX may include a light emitting element LED and a pixel circuit PXC. In an embodiment, the pixel circuit PXC may include first to seventh pixel transistors T1 to T7 and a storage capacitor Cst.

The first pixel transistor (or driving transistor) T1 may be connected between a first power line PL1 and a first electrode of the light emitting element LED. The first pixel transistor T1 may include a gate electrode connected to a first node N1. The first pixel transistor T1 may control, in response to the voltage of the first node N1, the amount of current (e.g., a driving current) flowing from the first power line PL1 to an electrode EP (or a power line) via the light emitting element LED. A first power voltage VDD may be provided to the first power line PL1. A second power voltage VSS may be provided to the electrode EP. The first power voltage VDD may be set to a voltage higher than the second power voltage VSS. For example, the first power voltage VDD may be approximately 4.6 V, and the second power voltage VSS may be approximately 2.6 V.

The second pixel transistor T2 may be connected between the j-th data line Dj and a second node N2. The second node N2 may be connected to a terminal of the first pixel transistor T1. A gate electrode of the second pixel transistor T2 may be coupled to the i-th first scan line S1i. When a first scan signal GW[i] (e.g., a first scan signal having a low level) is supplied to the i-th first scan line S1i, the second pixel transistor T2 may be turned on to electrically connect the j-th data line Dj to the second node N2.

The third pixel transistor T3 may be connected between the first node N1 and a third node N3. For example, the third pixel transistor T3 may be connected to the first pixel transistor T1 at the first node N1 and the third node N3. A gate electrode of the third pixel transistor T3 may be connected to an i-th fourth scan line S4i. The third pixel transistor T3 may be turned on when a fourth scan signal GC[i] is supplied to the i-th fourth scan line S4i. If the third pixel transistor T3 is turned on, the first pixel transistor T1 may have the form of a diode.

The fourth pixel transistor T4 may be connected between the first node N1 and the second power line PL2. A gate electrode of the fourth pixel transistor T4 may be connected to an i-th second scan line S2i. A first initialization power voltage Vint1 may be provided to the second power line PL2. For example, the first initialization power voltage Vint1 may be approximately −3.8 V. The fourth pixel transistor T4 may be turned on by a second scan signal GI[i] supplied to the i-th second scan line S2i. If the fourth pixel transistor T4 is turned on, a first initialization power voltage Vint1 may be supplied to the first node N1 (e.g., the gate electrode of the first pixel transistor T1).

The fifth pixel transistor T5 may be coupled between the first power line PL1 and the second node N2. A gate electrode of the fifth transistor T5 may be connected to an i-th emission control line Ei. The sixth pixel transistor T6 may be connected between the third node N3 and the light emitting element LED (or a fourth node N4). A gate electrode of the sixth pixel transistor T6 may be connected to the i-th emission control line Ei. The fifth pixel transistor T5 and the sixth pixel transistor T6 may be turned off when an emission control signal EM[i] (e.g., an emission control signal EM[i] having a high level) is supplied to the i-th emission control line Ei, and may be turned on in the other cases.

The seventh pixel transistor T7 may be connected between the first electrode (e.g., the fourth node N4) of the light emitting element LED and a third power line PL3. A gate electrode of the seventh pixel transistor T7 may be connected to an i-th third scan line S3i. A second initialization power voltage Vint2 may be provided to the third power line PL3. For example, the second initialization power voltage Vint2 may be approximately −3.8 V. In an embodiment, the second initialization power voltage Vint2 may differ from the first initialization power voltage Vint1. The seventh pixel transistor T7 may be turned on by a third scan signal GB[i] supplied to the i-th third scan line S3i, so that the second initialization power voltage Vint2 may be supplied to the first electrode of the light emitting element LED.

The storage capacitor Cst may be connected between the first power line PL1 and the first node N1.

The sensor circuit SC may include first to third sensor transistors M1 to M3.

The first and second sensor transistors M1 and M2 may be connected in series between a fifth power line PL5 and a k-th readout line RXk (where k is a natural number).

The first sensor transistor M1 may be connected between the fifth power line PL5 and the second sensor transistor M2. A gate electrode of the first sensor transistor M1 may be connected to a fifth node N5 (or a sensor node). A common voltage VCOM may be provided to the fifth power line PL5. For example, the common voltage VCOM may be approximately −3.8 V. In an embodiment, the fifth power line PL5 may be electrically connected to or integrally formed with the second power line PL2 or the third power line PL3. The common voltage VCOM applied to the fifth power line PL5 may be the same as the first initialization power voltage Vint1 or the second initialization power voltage Vint2.

The second sensor transistor M2 may be connected between the first sensor transistor M1 and the k-th readout line RXk. A gate electrode of the second sensor transistor M2 may be coupled to the i-th first scan line S1i. In other words, the gate electrode of the second sensor transistor M2 and the gate electrode of the second pixel transistor T2 may share the i-th first scan line S1i.

The third sensor transistor M3 may be connected between a fourth power line PL4 (or a reference power line) and the fifth node N5. The gate electrode of the third sensor transistor M3 may be connected to the reset control line RSTL. A reset voltage VRST may be provided to the fourth power line PL4. The reset voltage VRST may be approximately −7 V.

At least one light receiving element LRD may be connected between the fifth node N5 and the electrode EP to which the second power voltage VSS is to be provided.

The light receiving element LRD may generate a charge (or current) based on incident light. In other words, the light receiving element LRD may perform a function of photoelectric transformation. For example, the light receiving element LRD may be a photo diode.

If the third sensor transistor M3 is turned on in response to the reset signal RST supplied to the reset control ling RSTL, the reset voltage VRST may be provided to the fifth node N5. For example, the voltage of the fifth node N5 may be reset by the reset voltage VRST. After the reset voltage VRST has been applied to the fifth node N5, the light receiving element LRD may perform a function of photoelectric transformation.

The voltage of the fifth node N5 may be changed by the operation of the light receiving element LRD. The voltage of the fifth node N5 (or the charge or current generated from the light receiving element LRD) may be changed depending on the intensity of light that is incident on the light receiving element LRD or the time during which light is incident (or the time during which the light receiving element LRD is exposed).

If the second sensor transistor M2 is turned on by the first scan signal GW[i] applied to the i-th first scan line S1i, a detection value (e.g., a current and/or voltage) generated based on the voltage of the fifth node N5 may flow to the k-th readout line RXk.

In an embodiment, each of the pixel circuit PXC and the sensor circuit SC may include a P-type transistor and an N-type transistor. In an embodiment, the third pixel transistor T3, the fourth pixel transistor T4, and the third sensor transistor M3 each may be formed of an oxide semiconductor transistor. For example, the third pixel transistor T3, the fourth pixel transistor T4, and the third sensor transistor M3 each may be formed of an N-type oxide semiconductor transistor, and may include an oxide semiconductor layer as an active layer.

The oxide semiconductor transistor may be produced through a low-temperature process, and have low charge mobility compared to that of the poly-silicon semiconductor transistor. In other words, the oxide semiconductor transistor may have excellent off-current characteristics. Therefore, generation of leakage current at the third pixel transistor T3, the fourth pixel transistor T4, and the third sensor transistor M3 may be minimized.

The other transistors of the pixel circuit PXC and the sensor circuit SC may each be formed of a poly-silicon transistor, and may include a poly-silicon semiconductor layer as an active layer. For example, the active layer may be formed through a low-temperature poly-silicon process. For example, the poly-silicon transistor may be a P-type poly-silicon transistor. Because a poly-silicon semiconductor transistor has a high response speed, the poly-silicon semiconductor transistor may be applied in a switching element in which a high-speed switching operation is required.

As described above, the pixel circuit PXC and the sensor circuit SC may share a scan line (e.g., the i-th first scan line S1i), so that the pixel circuit PXC and the sensor circuit SC may be simultaneously scanned. In this case, the number of lines disposed on the display panel 100 (refer to FIG. 1) is reduced, and a reduction in resolution due to the lines (e.g., a large number of lines) can be mitigated. Furthermore, a driver (e.g., the scan driver 211) for driving the pixel PX and the photo sensor PHS may have an integrated structure, so that a space needed for the driver can be reduced.

Figure 6:
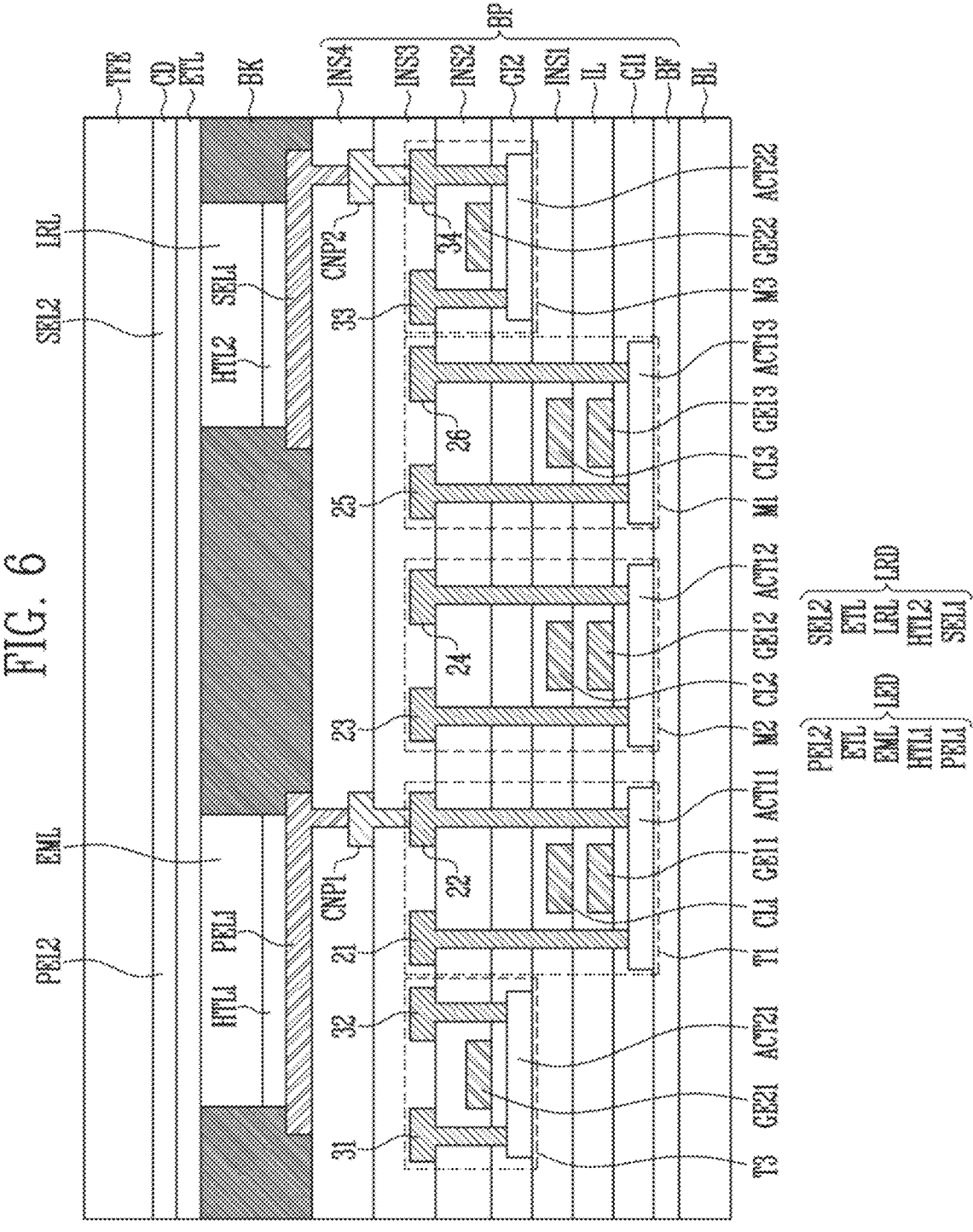
FIG. 6 is a sectional view illustrating an example of the display area of FIG. 4.

FIG. 6 is a sectional view illustrating an example of the display area AA of FIG. 4.

Referring to FIGS. 1 to 6, the pixel transistors T1 to T7 and the sensor transistors M1 to M3 may be included in a backplane structure BP (or a circuit layer) of the display panel 100.

FIG. 6 illustrates the first pixel transistor T1, the third pixel transistor T3, the first sensor transistor M1, the second sensor transistor M2, and the third sensor transistor M3.

A base layer BL may be made of insulating material such as glass or resin. Furthermore, the base layer BL may be made of material having flexibility so as to be bendable or foldable, and have a single-layer or multi-layer structure.

The backplane structure BP including the pixel circuit PXC and the sensor circuit SC may be provided in the base layer BL. The backplane structure BP may include a semiconductor layer, a plurality of conductive layers, and a plurality of insulating layers which will be described below. A buffer layer BF may be formed on the base layer BL. The buffer layer BF may prevent impurities from diffusing into the pixel transistors (e.g., the first to seventh pixel transistors T1 to T7) and the sensor transistors (e.g., the first to third sensor transistors M1 to M3). The buffer layer BF may be omitted depending on the material of the base layer BL or processing conditions.

First to third active patterns ACT11, ACT12, and ACT13 may be provided on the buffer layer BF. In an embodiment, the first to third active patterns ACT11, ACT12, and ACT13 may each be formed of a poly-silicon semiconductor. For example, the first to third active patterns ACT11, ACT12, and ACT13 may be formed, for example, through a low-temperature poly-silicon (LTPS) process.

A first gate insulating layer GI1 may be provided on the first to third active patterns ACT11, ACT12, and ACT13.

The first gate insulating layer GI1 may be an inorganic insulating layer formed of an inorganic material.

First to third gate electrodes GE11, GE12, and GE13 may be provided on the first gate insulating layer GI1. The first gate electrode GE11 may overlap a channel area of the first active pattern ACT11. The second gate electrode GE12 may overlap a channel area of the second active pattern ACT12. The third gate electrode GE13 may overlap a channel area of the third active pattern ACT13.

The first to third gate electrodes GE11, GE12, and GE13 may each be formed of metal. For example, the first to third gate electrodes GE11, GE12, and GE13 may each be made of at least one of metals such as gold (Au), silver (Ag), aluminum (Al), molybdenum (Mo), chrome (Cr), titanium (Ti), nickel (Ni), neodymium (Nd), copper (Cu), and an alloy of the metals. Furthermore, the first to third gate electrodes GE11, GE12, and GE13 may each have a single-layer structure, or a multi-layer structure formed by stacking layers made of two or more materials of metals and alloys.

An interlayer insulating layer IL may be provided on the first to third gate electrodes GE11, GE12, and GE13. The interlayer insulating layer IL may be an inorganic insulating layer formed of an inorganic material. Polysiloxane, silicon nitride, silicon oxide, silicon oxynitride, or the like may be used as the inorganic material.

Conductive patterns CL1, CL2, and CL3 may be provided on the interlayer insulating layer IL. The conductive patterns CL1, CL2, and CL3 may each form at least one of one electrode of the storage capacitor Cst, the scan lines S1i to S4i (and the scan line SLi, the reset line RSTLi), the data line Dj (and the readout line Rxk), and the power lines PL1 to PL4.

The conductive patterns CL1, CL2, and CL3 may be made of at least one of metals such as gold (Au), silver (Ag), aluminum (Al), molybdenum (Mo), chrome (Cr), titanium (Ti), nickel (Ni), neodymium (Nd), copper (Cu), or an alloy of the metals. The conductive patterns CL1, CL2, and CL3 may each have a single layer structure, but they are not limited thereto, and they may each have a multi-layer structure formed by stacking two or more materials of metals and alloys.

A first insulating layer INS1 may be provided on the conductive patterns CL1, CL2, and CL3. The first insulating layer INS1 may be an inorganic insulating layer formed of an inorganic material. Polysiloxane, silicon nitride, silicon oxide, silicon oxynitride, or the like may be used as the inorganic material.

A fourth active pattern ACT21 and a fifth active pattern ACT22 may be provided on the first insulating layer INS1. In an embodiment, the fourth and fifth active patterns ACT21 and ACT22 each may be formed of an oxide semiconductor. For example, the fourth and fifth active patterns ACT21 and ACT22 may each be formed through a metal oxide semiconductor forming process.

A second gate insulating layer GI2 may be provided on the fourth active pattern ACT21 and the fifth active pattern ACT22. The second gate insulating layer GI2 may be an inorganic insulating layer formed of an inorganic material.

Fourth and fifth gate electrodes GE21 and GE22 may be provided on the second gate insulating layer GI2. The fourth gate electrode GE21 may overlap a channel area of the fourth active pattern ACT21. The fifth gate electrode GE22 may overlap a channel area of the fifth active pattern ACT22.

A second insulating layer INS2 may be provided on the fourth and fifth gate electrodes GE21 and GE22. For example, the second insulating layer INS2 may be an inorganic insulating layer formed of an inorganic material.

First source/drain electrodes 21 and 22, second source/drain electrodes 23 and 24, third source/drain electrodes 25 and 26, fourth source/drain electrodes 31 and 32, and fifth source/drain electrodes 33 and 34 may be provided on the second insulating layer INS2. The first to fifth source/drain electrodes 21, 22, 23, 24, 25, 26, 31, 32, 33, and 34 may be connected to corresponding first to fifth active patterns ACT11, ACT12, ACT13, ACT21, and ACT22 through individual contact holes.

The first to fifth source/drain electrodes 21, 22, 23, 24, 25, 26, 31, 32, 33, and 34 may be formed of metal.

A third insulating layer INS3 may be provided on the first to fifth source/drain electrodes 21, 22, 23, 24, 25, 26, 31, 32, 33, and 34. For example, the third insulating layer INS3 may be an inorganic insulating layer formed of an inorganic material.

Connection patterns CNP1 and CNP2 may be provided on the third insulating layer INS3. The first connection pattern CNP1 may be connected to the first drain electrode 22 through a contact hole that passes through the third insulating layer INS3. The second connection pattern CNP2 may be connected to the fifth drain electrode 34 (or source electrode) through a contact hole that passes through the third insulating layer INS3.

The connection patterns CNP1 and CNP2 may be made of at least one of metals such as gold (Au), silver (Ag), aluminum (Al), molybdenum (Mo), chrome (Cr), titanium (Ti), nickel (Ni), neodymium (Nd), copper (Cu), or an alloy of the metals.

A fourth insulating layer INS4 may be disposed on the connection patterns CNP1 and CNP2. The fourth insulating layer INS4 may be an organic insulating layer formed of an organic material, or an inorganic insulating layer formed of an inorganic material. In an embodiment, the fourth insulating layer INS4 may function as a planarization layer.

A pixel layer including a first pixel electrode PEL1, a first sensor electrode SEL1, and a bank layer BK may be provided on the fourth insulating layer INS4. For example, the pixel layer may be in direct contact with the fourth insulating layer INS4.

The pixel layer may include a light emitting element LED connected to the pixel circuit PXC, and a light receiving element LRD connected to the sensor circuit SC.

In an embodiment, the light emitting element LED may include a first pixel electrode PEL1, a hole transfer layer HTL1, a light emitting layer EML, an electron transfer layer ETL, and a second pixel electrode PEL2. In an embodiment, the light receiving element LRD may include a first sensor electrode SEL1, a second hole transfer layer HTL2, a light receiving layer LRL, an electron transfer layer ETL, and a second sensor electrode SEL2.

In an embodiment, the first pixel electrode PEL1 and the first sensor electrode SEL1 may be formed of a metal layer made of Ag, Mg, Al, Pt, Pd, Au, Ni, Nd, Ir, Cr, or an alloy of them, and/or indium tin oxide (ITO), indium zinc oxide (IZO), zinc oxide (ZnO), indium tin zinc oxide (ITZO), or the like. The first pixel electrode PEL1 may be connected to the first drain electrode 22 through a first contact hole. The first contact hole may be formed in the fourth insulating layer INS4. The first sensor electrode SEL1 may be connected to the fifth drain electrode 34 through a second contact hole. The second contact hole may be formed in the fourth insulating layer INS4.

The first pixel electrode PEL1 and the second sensor electrode SEL1 may be simultaneously formed through a patterning process using a mask.

The bank layer BK (or a pixel defining layer) for defining a light emitting area and a light receiving area may be provided on the fourth insulating layer INS4 on which the first pixel electrode PEL1 and the first sensor electrode SEL1 are formed. The bank layer BK may be an organic insulating layer formed of an organic material. The organic material may include acryl resin, epoxy resin, phenolic resin, polyamide resin, polyimide resin, and the like.

Furthermore, the bank layer BK may include a light absorbing material, or a light absorbent may be applied to the bank layer BK, so that the bank layer BK can function to absorb light introduced from the outside. For example, the bank layer BNK may include a carbon-based black pigment. However, the present disclosure is not limited thereto. The bank layer BK may include an opaque metal such as chrome (Cr), molybdenum (Mo), an alloy (MoTi) of molybdenum and titanium, tungsten (W), vanadium (V), niobium (Nb), tantalum (Ta), manganese (Mn), cobalt (Co), or nickel (Ni), having high light absorptivity.

The bank layer BK may include openings corresponding to the light emitting area and the light receiving area.

The first hole transfer layer HTL1 may be provided on an upper surface of the first pixel electrode PEL1 that is exposed from the bank layer BK. The second hole transfer layer HTL2 may be provided on an upper surface of the first sensor electrode SEL1 that is exposed from the bank layer BK. Holes may be transferred to the light emitting layer EML through the first hole transfer layer HTL1. Holes may be transferred to the light receiving layer LRL through the second hole transfer layer HTL2.

In an embodiment, the first hole transfer layer HTL1 and the second hole transfer layer HTL2 may be identical to or different from each other, depending on the materials of the light emitting layer EML and the light receiving layer LRL.

The light emitting layer EML may be provided on the first hole transfer layer HTL1. In an embodiment, the light emitting layer EML may be formed of an organic light emitting layer. The light emitting layer EML may emit light such as red light, green light, or blue light, depending on the organic material included in the light emitting layer EML.

In an embodiment, an electron blocking layer may be provided on the second hole transfer layer HTL2 in the light receiving area. The electron blocking layer may prevent charges of the light receiving layer LRL from being transferred to the hole transfer layer HTL. In an embodiment, the electron blocking layer may be omitted.

The light receiving layer LRL may be disposed on the second hole transfer layer HTL2. The light receiving layer LRL may sense the intensity of light by emitting electrons in response to light of a specific wavelength band.

In an embodiment, the light receiving layer LRL may include a low-molecular organic material. For example, the light receiving layer LRL may be made of a phthalocyanine compound including one or more metals selected from the group consisting of copper (Cu), iron (Fe), nickel (Ni), cobalt (Co), manganese (Mn), aluminum (Al), palladium (Pd), tin (Sn), indium (In), lead (Pb), titanium (Ti), rubidium (Rb), vanadium (V), gallium (Ga), terbium (Tb), cerium (Ce), lanthanum (La), and zinc (Zn).

Alternatively, the low-molecular organic material included in the light receiving layer LRL may be formed of a bi-layer structure including both a layer including a phthalocyanine compound including one or more metals selected from the group consisting of copper (Cu), iron (Fe), nickel (Ni), cobalt (Co), manganese (Mn), aluminum (Al), palladium (Pd), tin (Sn), indium (In), lead (Pb), titanium (Ti), rubidium (Rb), vanadium (V), gallium (Ga), terbium (Tb), cerium (Ce), lanthanum (La), and zinc (Zn) and a layer including C60, or may be formed of a mixing layer in which a phthalocyanine compound and C60 are mixed with each other.

However, this is merely an example, and the light receiving layer LRL may include a high-molecular organic layer.

In an embodiment, the light receiving layer LRL may determine a light detection bank of the photo sensor by controlling the selection of metal components included in the phthalocyanine compound. For example, a phthalocyanine compound including copper may absorb a visible light wavelength of a band ranging from approximately 600 nm to approximately 800 nm. A phthalocyanine compound including tin (Sn) may absorb a near-infrared ray wavelength of a band ranging from approximately 800 nm to approximately 1000 nm. Therefore, a photo sensor capable of detecting a wavelength of a band desired by a user can be implemented by controlling the selection of metals included in the phthalocyanine compound. For example, the light receiving layer LRL may be formed to selectively absorb a wavelength of a red light band, a wavelength of a green light band, or a wavelength of a blue light band.

In an embodiment, the surface area of the light receiving area may be less than that of the light emitting area.

The second pixel electrode PEL2 and the second sensor electrode SEL2 may be provided on the electron transfer layer ETL. In an embodiment, the second pixel electrode PEL2 and the second sensor electrode SEL2 may be included in a common electrode CD which is integrally formed in the display area AA. The second power voltage VSS may be supplied to the second pixel electrode PEL2 and the second sensor electrode SEL2.

The common electrode CD may be formed of a metal layer made of Ag, Mg, Al, Pt, Pd, Au, Ni, Nd, Ir, Cr, or the like, and/or a transparent conductive layer made of ITO, IZO, ZnO, ITZO, or the like. In an embodiment, the common electrode CD may be formed of a multi-layer structure having two or more layers including a thin metal layer. For example, the common electrode CD may be formed of a triple-layer structure of ITO/Ag/ITO.

An encapsulation layer TFE may be provided on the common electrode CD including the second pixel electrode PEL2 and the second sensor electrode SEL2. The encapsulation layer TFE may have a single-layer structure, or may have a multi-layer structure. In an embodiment, the encapsulation layer TFE may have a stacked structure formed by successively depositing an inorganic material, an organic material, and an inorganic material. An uppermost layer of the encapsulation layer TFE may be formed of inorganic material.

Figure 7:
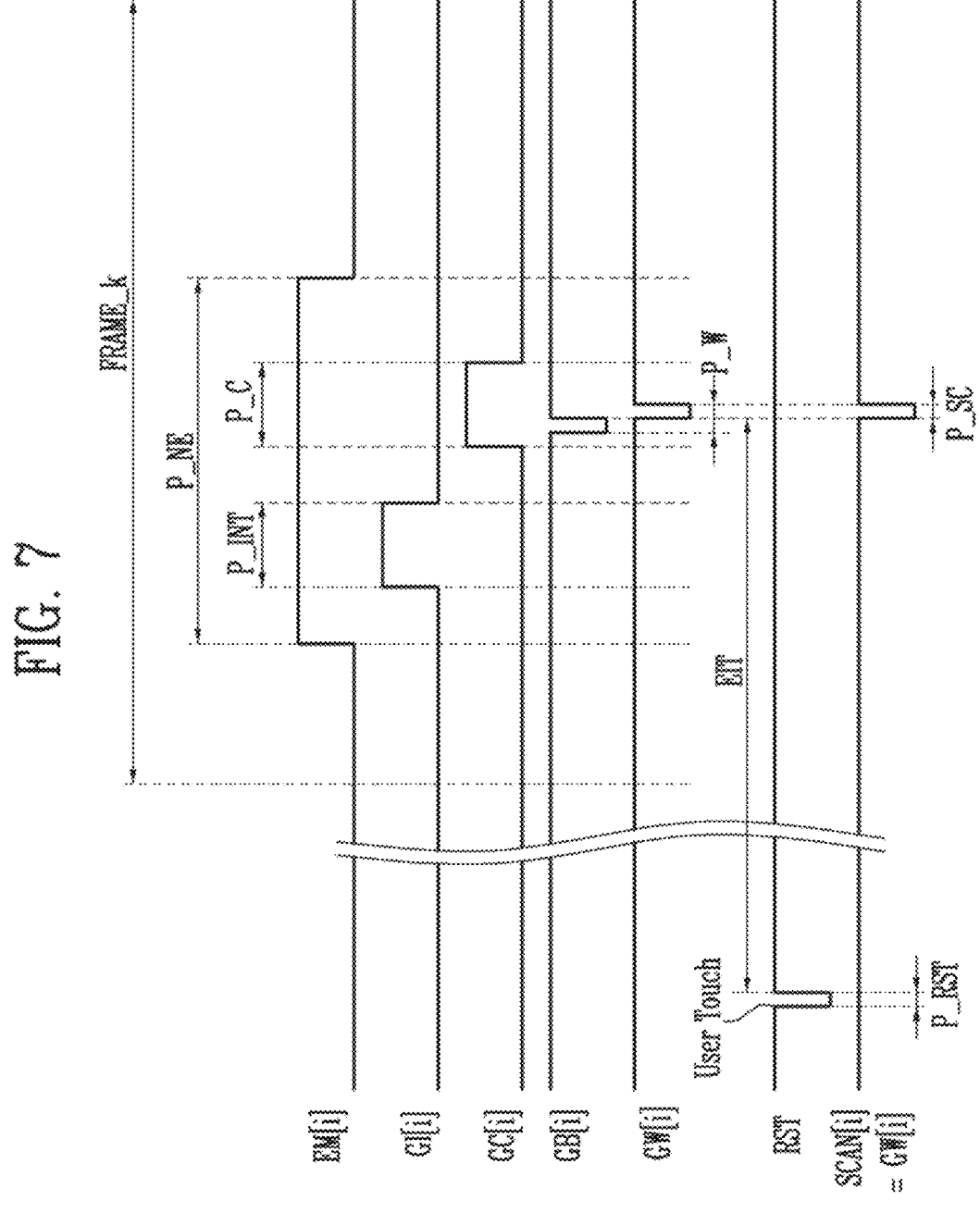
FIG. 7 is a waveform diagram for describing an embodiment of the operation of the pixel and the photo sensor of FIG. 5.

FIG. 7 is a waveform diagram for describing an embodiment of the operation of the pixel and the photo sensor of FIG. 5.

Referring to FIGS. 1, 2, 5, and 7, the emission control signal EM[i] may be provided to the i-th emission control line Ei, the second scan signal GI[i] may be provided to the i-th second scan line S2i, the fourth scan signal GC[i] may be provided to the i-th fourth scan line S4i, the third scan signal GB[i] may be provided to the i-th third scan line S3i, and the first scan signal GW[i] may be provided to the i-th first scan line S1i. The reset signal RST may be provided to the reset control line RSTL. The sensing scan signal SCAN [i] (or the i-th sensing scan signal) may refer to a signal which is provided to the gate electrode of the second sensor transistor M2. Because the gate electrode of the second sensor transistor M2 is connected to the i-th first scan line S1*i*, the sensing scan signal SCAN[i] may be the first scan signal GW[i].

A k-th frame period FRAME_k may include a non-emission period P_NE. The non-emission period P_NE (or the k-th frame period FRAME_k) may include an initialization period P_INT, a compensation period P_C, and a write period P_W. The write period P_W may be included in the compensation period P_C. For example, the write period P_W may include one horizontal time, each of the initialization period P_INT and the compensation period P_C may include six horizontal times, and the non-emission period P_NE may include twenty-six horizontal times, but the present disclosure is not limited thereto.

In the non-emission period P_NE, the emission control signal EM[i] may have a high level. In this case, in response to the emission control signal EM[i] having a high level, the fifth pixel transistor T5 and the sixth pixel transistor T6 may be turned off, and the pixel PX may not emit light.

In the initialization period P_INT, the second scan signal GI[i] may have a high level. In the initialization period P_INT, the third and fourth scan signals GB[i] and GC[i] may have a low level. In this case, in response to the second scan signal GI[i] having a high level, the fourth pixel transistor T4 may be turned on, and the first initialization power voltage Vint1 of the second power line PL2 may be provided to the first node N1 (or the gate electrode of the first pixel transistor T1).

Thereafter, during the compensation period P_C, the fourth scan signal GC[i] may have a high level. In response to the fourth scan signal GC[i] having a high level, the third pixel transistor T3 may be turned on, and the first pixel transistor T1 may be connected in the form of a diode. Also during the compensation period P_C, the first and third scan signals GW[i] and GB[i] may transition to a low level.

In the write period P_W, the first scan signal GW[i] may have a low level. In this case, in response to the first scan signal GW[i] having a low level, the second pixel transistor T2 may be turned on, and a data signal may be provided from the data line Dj to the second node N2. Furthermore, because the third pixel transistor T3 remains turned on in response to the fourth scan signal GC[i] having a high level, the data signal may be transmitted from the second node N2 to the first node N1 through the first pixel transistor T1 and the third pixel transistor T3. Because the first pixel transistor T1 remains connected in the form of a diode by the turned-on third pixel transistor T3, the voltage of the first node N1 may have a voltage obtained by compensating the data signal for a threshold voltage of the first pixel transistor T1.

Before the write period P_W, the third scan signal GB[i] may have a low level. In this case, the seventh pixel transistor T7 may be turned on in response to the third scan signal GB[i], and the second initialization power voltage Vint2 may be supplied to the first electrode of the light emitting element LED. The third scan signal GB[i] may be a first scan signal provided to a previous row, but the present disclosure is not limited thereto.

Subsequently, the non-emission period P_NE may be terminated, and the emission control signal EM[i] may have a low level. In this case, in response to the emission control signal EM[i] having a low level, the fifth pixel transistor T5 and the sixth pixel transistor T6 may be turned on, and a current transfer path may be formed from the first power line PL1 to the electrode EP through the fifth pixel transistor T5, the first pixel transistor T1, the sixth pixel transistor T6, and the light emitting element LED. Furthermore, driving current corresponding to a voltage (e.g., a data signal) of the first node N1 may flow through the light emitting element LED by the operation of the first pixel transistor T1, so that the light emitting element LED may emit light having a luminance corresponding to the driving current.

In the reset period P_RST before the k-th frame period FRAME_k, the reset signal RST may have a low level. In the case where a touch input from the user or a fingerprint sensing request is generated, the reset circuit 221 (refer to FIG. 2) may provide the reset signal RST having a low level to the reset control line RSTL. In response to the reset signal RST having a low level, the third sensor transistor M3 may be turned on, and the reset voltage VRST may be applied to the fifth node N5. The voltage of the fifth node N5 may be reset by the reset voltage VRST.

Thereafter, the second sensor transistor M2 may be turned off in response to the reset signal RST having a high level. In the case where light is incident on the light receiving element LRD during an exposure time EIT, the voltage of the fifth node N5 may be changed by the photoelectric transformation function of the light receiving element LRD.

In a sensing scan period P_SC of the k-th frame period FRAME_k, the sensing scan signal SCAN[i], e.g., the first scan signal GW[i], may have a low level. The sensing scan period P_SC may be the same as the write period P_W. In response to the first scan signal GW[i] having a low level, the second sensor transistor M2 may be turned on, so that the current (or a detected value) may flow from the fifth power line PL5 to the k-tk readout line RXk in response to the voltage of the fifth node N5.

For example, in the case where a touch from the user is inputted to the display panel 100, a current, e.g., a detected value, corresponding to light reflected by the user (e.g., the finger of the user) may be outputted in the k-th frame period FRAME_k. For example, the fingerprint of the user may be sensed based on the detected value.

Figure 8:
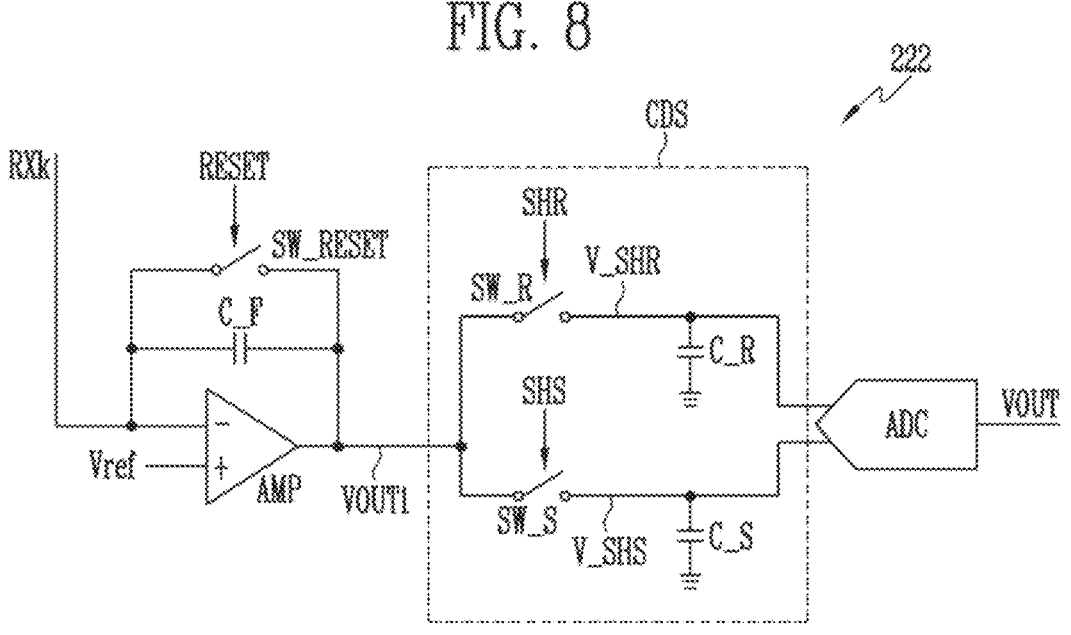
FIG. 8 is a view illustrating an embodiment of a readout circuit included in the display device of FIG. 2.

FIG. 8 is a view illustrating an embodiment of the readout circuit 222 included in the display device 1000 of FIG. 2. For convenience of explanation, FIG. 8 schematically illustrates the readout circuit 222 based on the k-th readout line RXk.

Referring to FIGS. 2, 5, and 8, the readout circuit 222 may include an integrating circuit, a correlated double sampling circuit CDS, and an analog-digital converter ADC.

The integrating circuit may be disposed between the k-th readout line RXk and the correlated double sampling circuit CDS.

The integrating circuit may include an amplifier AMP, a capacitor C_F, and a reset switch SW_RESET. A first input terminal (e.g., a negative (−) input terminal) of the amplifier AMP may be connected to the k-th readout line RXk. A reference voltage Vref may be applied to a second input terminal (e.g., a positive (+) input terminal) of the amplifier AMP.

The capacitor C_F may be connected between the first input terminal and an output terminal of the amplifier AMP. The reset switch SW_RESET may be connected in parallel to the capacitor C_F.

The reset switch SW_RESET may be operated in response to a first control signal RESET. The first control signal RESET (or an initialization signal), a second control signal SHR, and a third control signal SHS may be included in the readout control signal RCS (refer to FIG. 2), and may be provided from the controller 213 (refer to FIG. 2).

In the case where the reset switch SW_RESET is turned off, the capacitor C_F may integrate (or be charged with) charges (e.g., a sensing signal) provided to the first input terminal of the amplifier AMP, and the amplifier AMP may output an integrated sensing signal, e.g., a first output signal VOUT1, through the output terminal thereof.

In the case where the reset switch SW_RESET is turned on, the capacitor C_F may be initialized.

The correlated double sampling circuit CDS may be disposed between the integrating circuit and the analog-digital converter ADC.

The correlated double sampling circuit CDS may output a first sampling signal V_SHR in a status in which the integrating circuit (or the k-th readout line RXk) has been initialized (or reset), and a second sampling signal V_SHS (or a sensor sampling signal) in a status in which the integrating circuit has performed an integrating operation for a detected signal (e.g., a detected signal provided from the k-th readout line RXk). In the case where the first sampling signal V_SHR and the second sampling signal V_SHS are differentiated, noise included in the detected signal may be removed, and sensitivity (or sensing sensitivity) for the detected signal may be enhanced.

In an embodiment, the correlated double sampling circuit CDS may include a first sampling switch SW_R, a first sampling capacitor C_R, a second sampling switch SW_S, and a second sampling capacitor C_S.

The first sampling switch SW_R may be connected between the output terminal of the amplifier AMP (or the integrating circuit) and the first input terminal of the analog-digital converter ADC, and may be operated in response to the second control signal SHR. The first sampling capacitor C_R may be connected to the first input terminal of the analog-digital converter ADC. The first sampling switch SW_R and the first sampling capacitor C_R may form a first sampling circuit.

The first sampling switch SW_R may be turned on in response to the second control signal SHR immediately after the integrating circuit (and the k-th readout line RXk) is initialized. In this case, the first output signal VOUT of the initialized integrating circuit (and the k-th readout line RXk) may be stored in the first sampling capacitor C_R. In other words, the first sampling signal V_SHR in the status in which the integrating circuit (and the k-th readout line RXk) has been initialized (or reset) may be generated.

The second sampling switch SW_S may be connected between the output terminal of the amplifier AMP (or the integrating circuit) and the second input terminal of the analog-digital converter ADC, and may be operated in response to the third control signal SHS. The second sampling capacitor C_S may be connected to the second input terminal of the analog-digital converter ADC. The second sampling switch SW_S and the second sampling capacitor C_S may form a second sampling circuit.

After the integrating circuit sufficiently integrates the detected signal, the second sampling switch SW_S may be turned on in response to the third control signal SHS. In this case, a first output signal VOUT1 corresponding to the detected signal may be stored in the second sampling capacitor C_S. In other words, the second sampling signal V_SHS corresponding to the detected signal provided from the photo sensor PHS to the k-th readout line RXk may be generated.

The correlated double sampling circuit CDS is not limited to the foregoing configuration, and various other circuit configurations may be applied thereto.

The analog-digital converter ADC may differentiate the first sampling signal V_SHR and the second sampling signal V_SHS that are provided from the correlated double sampling circuit CDS, and may convert the differentiated signals to a digital sensing value VOUT and output the digital sensing value VOUT. For example, the analog-digital converter ADC may be implemented as a differential analog-digital converter. The present disclosure is not limited thereto. For example, the analog-digital converter ADC may be implemented as a single analog-digital converter, and a differential amplifier configured to differentiate the first sampling signal V_SHR and the second sampling signal V_SHS and output the differentiated value may be provided between the correlated double sampling circuit CDS and the analog-digital converter ADC.

Although it has been described that the readout circuit 222 uses a current sensing scheme (or a current integrating scheme), the present disclosure is not limited thereto. For example, the readout circuit 222 may use a voltage sensing scheme.

Figure 9:
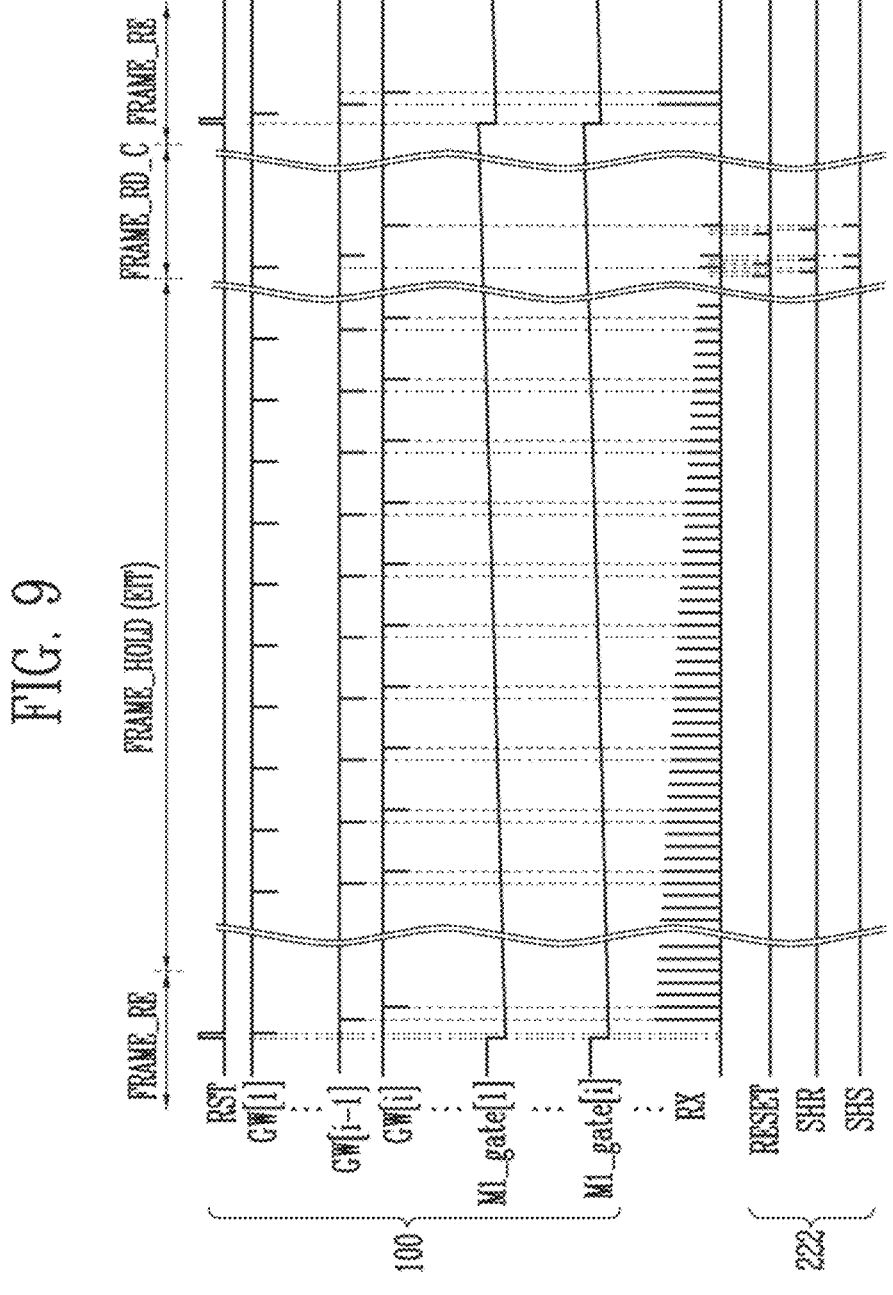
FIG. 9 is a view for describing a comparative embodiment of the operation of the display device of FIG. 2.
Figure 10:
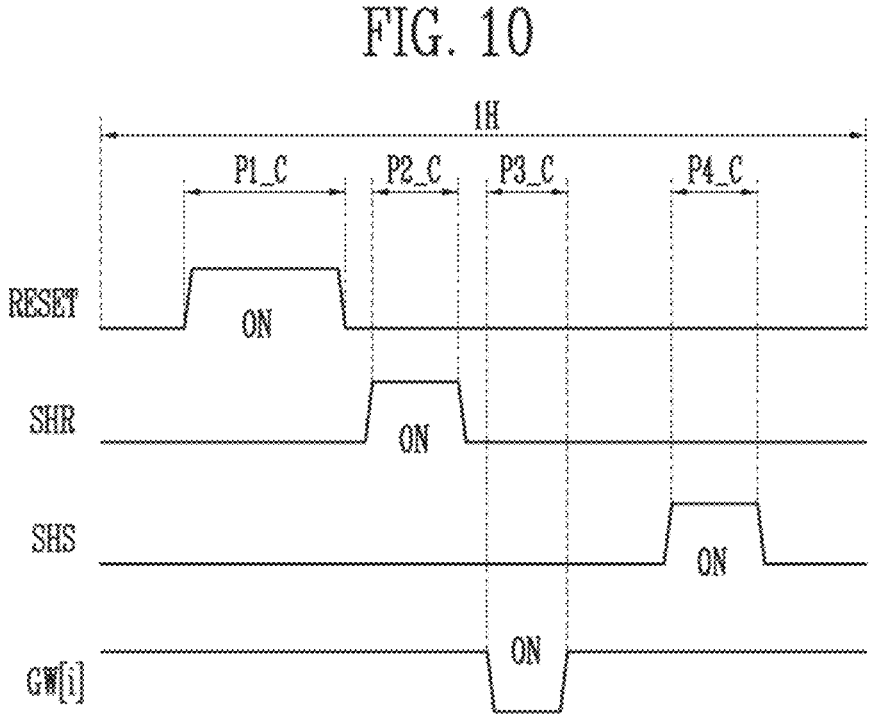
FIG. 10 is a view for describing a comparative embodiment of the operation of the readout circuit of FIG. 8.

FIG. 9 is a diagram for describing a comparative embodiment of the operation of the display device 1000 of FIG. 2. FIG. 10 is a diagram for describing a comparative embodiment of the operation of the readout circuit 222 of FIG. 8.

Referring to FIGS. 2, 5, 7, 8, and 9, a reset signal RST, first scan signals GW[1], GW[i−1], and GW[i], and gate voltages M1_gate[1] and M1_gate[i] may be signals that are provided to the display panel 100 or measured from the display panel 100. The reset signal RST may be provided to the reset control line RSTL. The first scan signals GW[1], GW[i−1], and GW[i] may be provided to the first scan lines S11 to Sin. For example, the 1st first scan signal GW[1] may be provided to the first scan line S11 of the first horizontal line (or the first pixel row). Likewise, the i−1-th first scan signal GW[i−1] may be provided to the first scan line of the i−1-th horizontal line, and the i-th first scan signal GW[i] may be provided to the first scan line G1i of the i-th horizontal line. The gate voltages M1_gate[1] and M1_gate [i] may be voltages on the gate electrode (e.g., the fifth node N5) of the first sensor transistor M1 of the photo sensors PHS that are located on the horizontal lines. For example, the first gate voltage M1_gate[1] may be a voltage on the gate electrode (e.g., the fifth node N5) of the first sensor transistor M1 of the photo sensor PHS (or the sensor circuit SC) that is located on the first horizontal line (or the first pixel row). Likewise, the i-th gate voltage M1_gate[i] may be a voltage on the gate electrode of the first sensor transistor M1 of the photo sensor PHS that is located on the i-th horizontal line.

The sensing signal RX may be a signal applied to the readout line (e.g., the k-th readout line RXk). For example, each of the pulses of the sensing signal RX may correspond to a sensing signal outputted from the photo sensor PHS of the corresponding horizontal line. Respective timings of the pulses of the sensing signal RX may be the same as that of the first scan signals GW[1], GW[i−1], and GW[i].

The first control signal RESET, the second control signal SHR, and the third control signal SHS may be provided to the readout circuit 222.

The first scan signals GW[1], GW[i−1], and GW[i] may be provided to the first scan lines S11 to Sin on a cycle of the frame period (or the frame). For example, the first scan signal GW[1] having a low level may be provided one time to the 1st first scan line S11 during each frame period. Although the number of times the first scan signal GW[1] is provided during each frame period is not limited thereto, for convenience of explanation, it will be assumed that each of the first scan signals GW[1], GW[i−1], and GW[i] is provided one time during each frame period. During each frame period, the first scan signals GW[1], GW[i−1], and GW[i] may be sequentially provided to the first scan lines S11 to Sin. For example, the first scan signals GW[1], GW[i−1], and GW[i] may be sequentially provided to the first scan lines S11 to Sin on a cycle of one horizontal time.

In an embodiment, in the case where touch input is generated, the reset signal RST may have a high level pulse. A frame period during which the reset signal RST has a high level pulse may be referred to as a reset frame period FRAME_RE.

In this case, all of the photo sensors PHS (or the fifth nodes N5 of the photo sensors PHS) that are provided in the display panel 100 may be reset by the reset voltage VRST during the reset frame period FRAME_RE. For example, the gate voltages M1_gate[1] and M1_gate[i] may each decrease from a specific voltage (e.g., a voltage level that has increased higher than the reset voltage VRST because the light receiving element LRD has previously been exposed to light) to the reset voltage VRST. Because the gate voltages M1_gate[1] and M1_gate[i] each have a low voltage level, a current that flows through the first sensor transistor M1 in the photo sensor PHS may be increased, and the sensing signal RX may have a high level.

Thereafter, during a hold frame period FRAME_HOLD, the gate voltages M1_gate[1] and M1_gate[i] may be gradually increased by light that is incident on the photo sensor PHS (or the light receiving element LRD), so that the sensing signal RX corresponding thereto may gradually decrease. The hold frame period FRAME_HOLD may include a plurality of frame periods and correspond to the exposure time EIT. Although varying depending on the performance of the display device 1000, for example, the exposure time EIT may be 100 ms and the hold frame period FRAME_HOLD may include approximately twelve frame periods based on a scan rate of 120 Hz.

During the reset frame period FRAME_RE and the hold frame period FRAME_HOLD, the first control signal RESET, the second control signal SHR, and the third control signal SHS each may remain at a low level (or a turn-off level at which the switch is turned off). Hence, the readout circuit 222 may perform no operation. For example, the readout (or sampling) operation for the sensing signal RX may not be performed.

Subsequently, during a readout frame period FRAME_RD_C, the first control signal RESET, the second control signal SHR, and the third control signal SHS may each have a high level (or a turn-on level at which the switch is turned on) on a cycle of one horizontal time. In other words, each of the first control signal RESET, the second control signal SHR, and the third control signal SHS may briefly transition high during the readout frame period FRAME_RD_C. In this case, during the readout frame period FRAME_RD_C, sensing signals RX of all of the photo sensors PHS in the display panel 100 (or all of the photo sensors PHS connected to the k-th readout line RXk) may be obtained.

Referring to FIGS. 10 and 8, one horizontal time 1H may be allocated to read out (sample) the sensing signal RX of the photo sensor PHS of the i-th horizontal line.

First, during a first period P1_C, the first control signal RESET may have a high level (or a turn-on level ON). Also during the first period P1_C, the second control signal SHR and the third control signal SHS may have a low level. In this case, during the first period P1_C, the reset switch SW_RESET may be turned on, and the readout circuit 222 (or the capacitor C_F, or the integrating circuit) and the readout line may be initialized or reset.

During a period other than the first period P1_C, the first control signal RESET may have a low level (or a turn-off level). In this case, the integrating circuit may integrate the sensing signal RX and output the integrated sensing signal RX.

During a second period P2_C, the second control signal SHR may have a high level and the third control signal SHS may have a low level. In this case, the first sampling signal V_SHR described with reference to FIG. 8 may be generated.

During a third period P3_C, the first scan signal GW[i] may have a low level. In this case, the second sensor transistor M2 may be turned on, and the sensing signal RX corresponding to the voltage (e.g., an i-th gate voltage M1_gate[i]) on the fifth node N5 of the photo sensor PHS located on the i-th horizontal line may be outputted to the readout line (e.g., the k-th readout line RXk).

Subsequently, during a fourth period P4_C, the third control signal SHS may have a high level and the second control signal SHR may have a low level. In this case, the second sampling signal V_SHS described with reference to FIG. 8 may be generated.

As described with reference to FIG. 8, the analog-digital converter ADC may differentiate the first sampling signal V_SHR and the second sampling signal V_SHS, and may convert the differentiated signals to a digital sensing value VOUT and output the digital sensing value VOUT. This way, during the readout frame period FRAME_RD_C, sensing signals RX of all of the photo sensors PHS in the display panel 100 (or all of the photo sensors PHS connected to the k-th readout line RXk) may be obtained.

Here, at least approximately 12.8 μs is required to successively perform the initialization (or reset) of the readout circuit 222 and the readout line, the generation of the first sampling signal V_SHR, and the generation of the second sampling signal V_SHS. However, because of an increase in surface area of the display device 1000 and a high scan rate, one horizontal time 1H corresponding to a readout time may be reduced to approximately 3.2 μs. In this case, in the case where the one horizontal time 1H is reduced, the sensing value VOUT may be reduced, or the range of the sensing value VOUT may be reduced. In other words, the sensing performance of the display device 1000 may be reduced, and valid biometric information (e.g., fingerprint information) for fingerprint authorization may not be obtained.

Therefore, in the display device 1000 in accordance with embodiments of the present disclosure, a plurality of horizontal times may be allocated as a readout time required to read out (or sample) the sensing signal RX of the photo sensor PHS of one horizontal line. In this case, the sensing signals RX of only some of the photo sensors PHS in the display panel 100 may be selectively read out during one frame period, and the sensing signals RX for all of the photo sensors PHS in the display panel 100 may be obtained during a plurality of frame periods. In other words, the display device 1000 may perform a readout operation in a time-sharing scheme during a plurality of frame periods.

Figure 11:
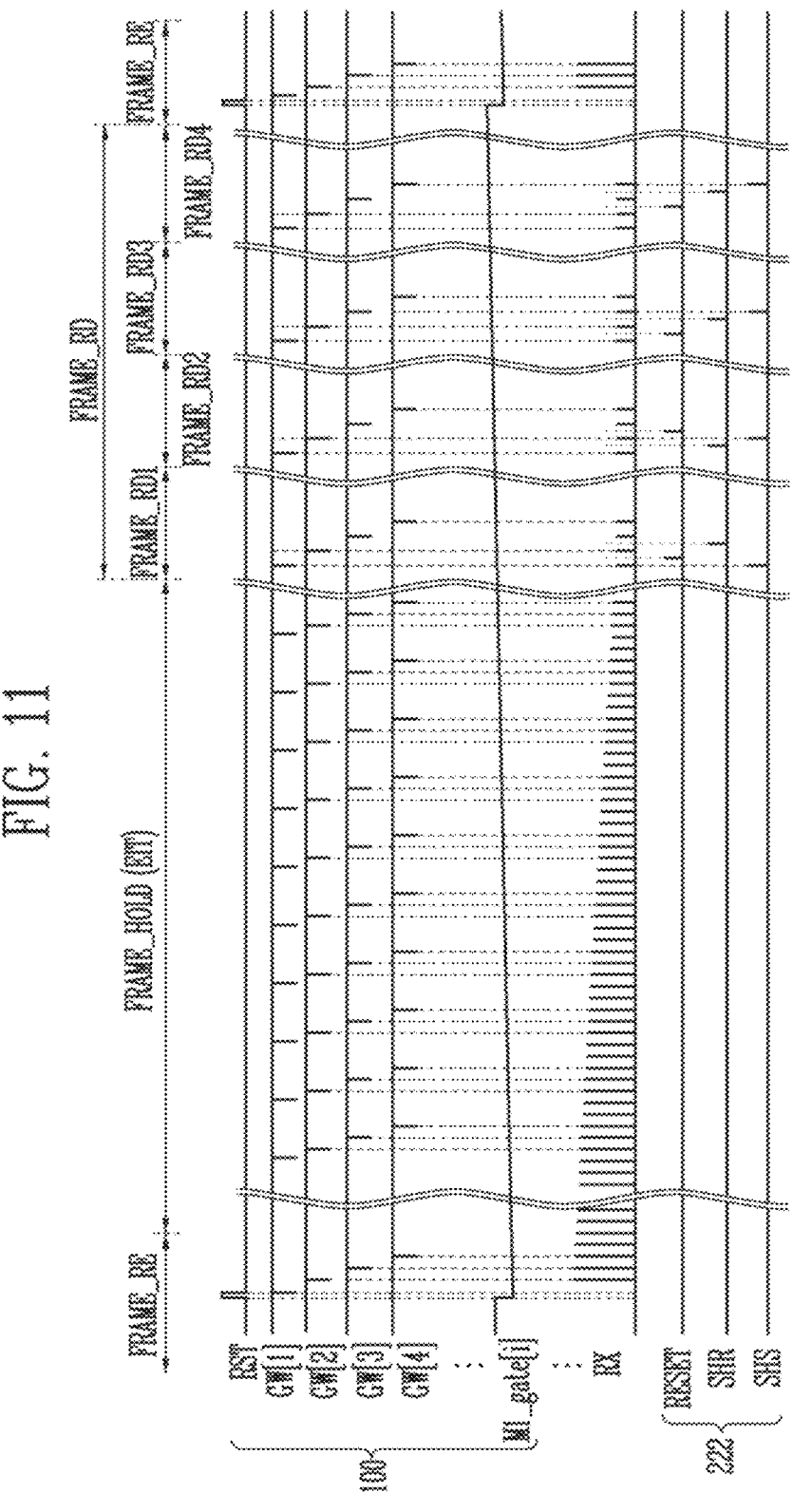
FIG. 11 is a view for describing an embodiment of the operation of the display device of FIG. 2.
Figure 12:
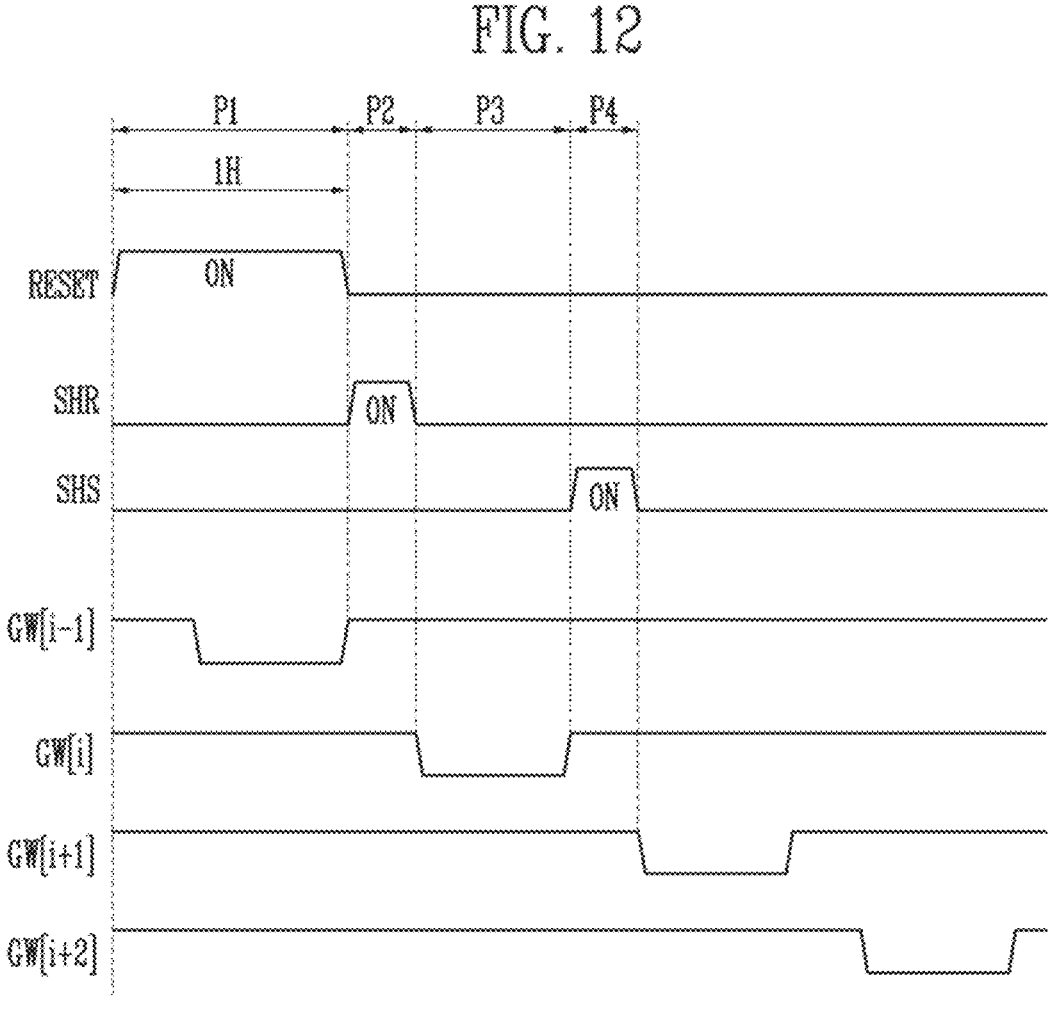
Figure 13:
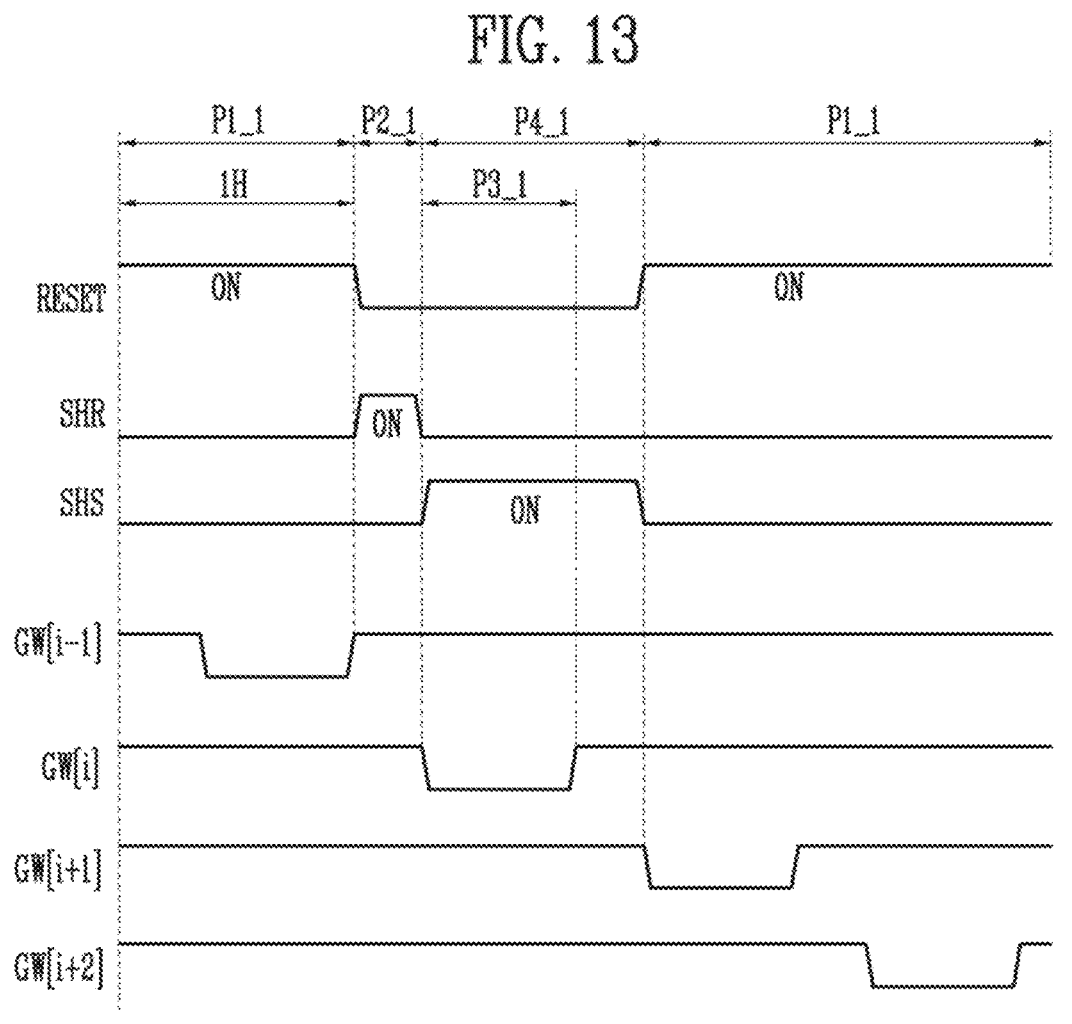
Figure 14:
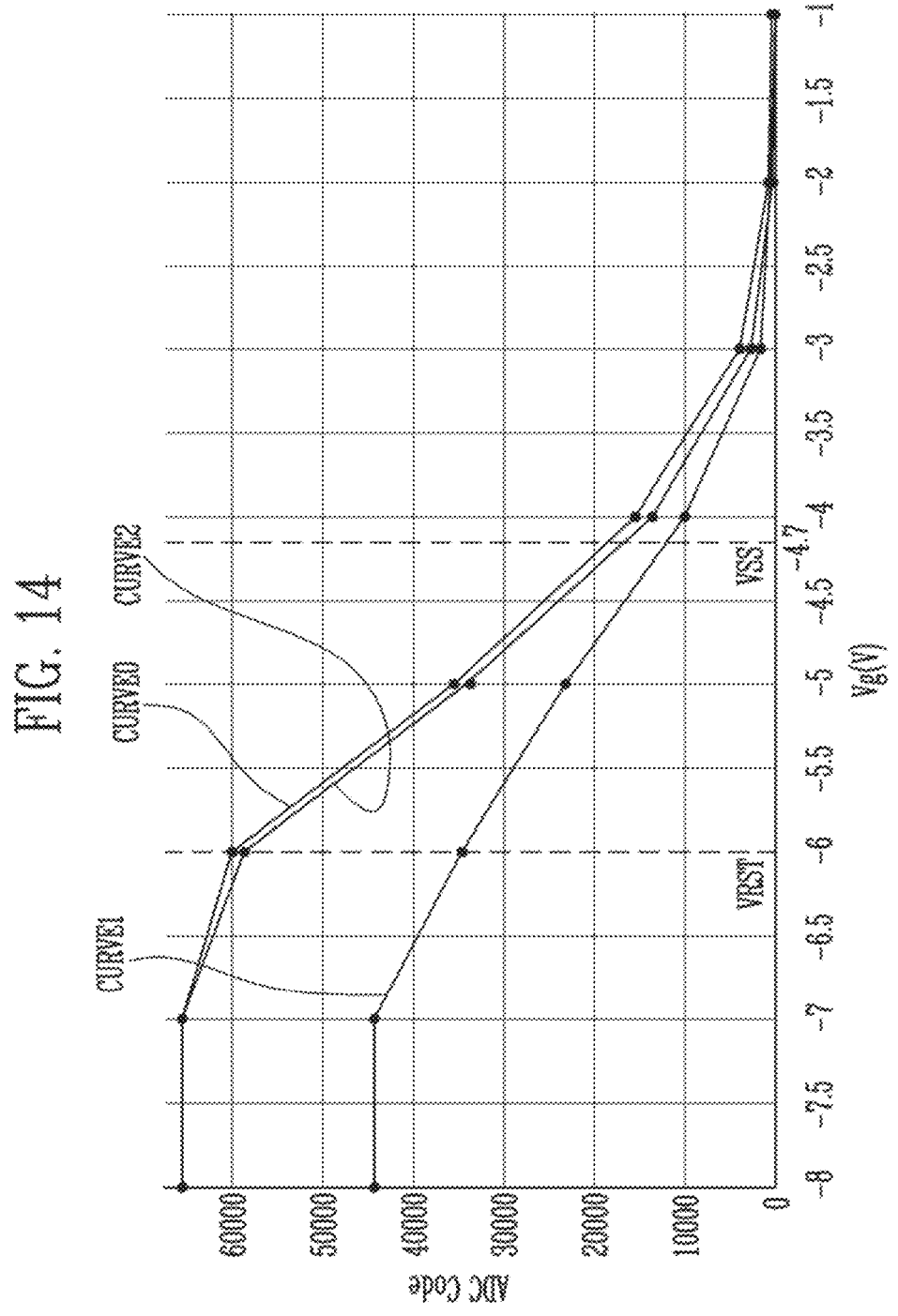
FIG. 14 is a diagram illustrating sensing values in accordance with embodiments of FIGS. 12 and 13.

FIG. 11 is a diagram for describing an embodiment of the operation of the display device 1000 of FIG. 2. FIGS. 12 and 13 are diagrams for describing an embodiment of the operation of the readout circuit 222 of FIG. 8. FIG. 14 is a diagram illustrating sensing values in accordance with embodiments of FIGS. 12 and 13.

Referring to FIGS. 2, 5, 7, 8, 9, and 11, the operation of the display device 1000 during the reset frame period FRAME_RE and the hold frame period FRAME_HOLD may be substantially the same as the operation of the display device 1000 in accordance with a comparative embodiment of FIG. 9. Therefore, a repetitive explanation thereof will be omitted.

The 1st first scan signal GW[1] may be provided to the first scan line S11 of the first horizontal line (or the first pixel row). Likewise, the 2nd first scan signal GW[2] may be provided to the first scan line of the second horizontal line. The 3rd first scan signal GW[3] may be provided to the first scan line of the third horizontal line. The 4th first scan signal GW[4] may be provided to the first scan line of the fourth horizontal line. In addition, the i-th scan signal GW[i] may be provided to the first scan line S1i of the i-th horizontal line (or the i-th pixel row). In other words, the scan signals GW[1] to GW[i] may be provided in sequence.

The readout frame period FRAME_RD may include a plurality of frame periods. For example, the readout frame period FRAME_RD may include a first frame period FRAME_RD1, a second frame period FRAME_RD2, a third frame period FRAME_RD3, and a fourth frame period FRAME_RD4 (or first to fourth readout frame periods).

In each of the first to fourth frame periods FRAME_RD1 to FRAME_RD4, each of the first control signal RESET, the second control signal SHR, and the third control signal SHS may have a high level (or a turn-on level at which the switch is turned on) on a cycle of four horizontal times (e.g., the time during which four scan signals successively have high level pulses). In this case, during each of the first to fourth frame periods FRAME_RD1 to FRAME_RD4, sensing signals RX of ¼ of all of the photo sensors PHS in the display panel 100 (or all of the photo sensors PHS connected to the k-th readout line RXk) may be read out or sampled.

For example, based on the third control signal SHS having a high level, a sensing signal RX for the photo sensor PHS of the first horizontal line to which the first scan signal GW[1] is to be applied may be read out during the first frame period FRAME_RD1. Likewise, based on the third control signal SHS having a high level, a sensing signal RX for the photo sensor PHS of the second horizontal line to which the first scan signal GW[2] is to be applied may be read out during the second frame period FRAME_RD2, a sensing signal RX for the photo sensor PHS of the third horizontal line to which the first scan signal GW[3] is to be applied may be read out during the third frame period FRAME_RD3, and a sensing signal RX for the photo sensor PHS of the fourth horizontal line to which the first scan signal GW[4] is to be applied may be read out during the fourth frame period FRAME_RD4. In other words, a sensing signal RX for the photo sensor PHS of a 4(x−1)+1-th horizontal line may be read out during the first frame period FRAME_RD1. A sensing signal RX for the photo sensor PHS of a 4(x−1)+2-th horizontal line may be read out during the second frame period FRAME_RD2. A sensing signal RX for the photo sensor PHS of a 4(x−1)+3-th horizontal line may be read out during the third frame period FRAME_RD3. A sensing signal RX for the photo sensor PHS of a 4x-th horizontal line may be read out during the fourth frame period FRAME_RD4. Here, x is a natural number.

Referring to FIGS. 12 and 8, four horizontal times may be allocated to read out (sample) the sensing signal RX of the photo sensor PHS of the i-th horizontal line. For example, one horizontal time 1H may be approximately 3.2 μs, and four horizontal times may be approximately 12.82 μs.

During the first period P1, the first scan signal GW[i−1] of the i−1-th horizontal line may have a low level (or a turn-on level). The first period P1 may correspond to one horizontal time 1H. During the first period Pa, the first scan signal GW[i] of the i-th horizontal line may have a high level, the first scan signal GW[i+1] of the i+1-th horizontal line may have a high level and the first scan signal GW[i+2] of the i+2-th horizontal line may have a high level.

Furthermore, during the first period P1, the first control signal RESET may have a high level (or a turn-on level ON). In this case, during the first period P1, the reset switch SW_RESET may be turned on, and the readout circuit 222 (or the capacitor C_F, or the integrating circuit) and the readout line may be initialized or reset.

During a period other than the first period P1, the first control signal RESET may have a low level (or a turn-off level). In this case, the integrating circuit may integrate the sensing signal RX and output the integrated sensing signal RX.

Subsequently, during a second period P2, the second control signal SHR may have a high level. In this case, the first sampling signal V_SHR described with reference to FIG. 8 may be generated. The second period P2 may be a period between the first scan signal GW[i−1] of the i−1-th horizontal line and the first scan signal GW[i] of the i-th horizontal line (or between periods during which the first scan signal GW[i−1] and the first scan signal GW[i] are applied). The second period P2 may be less than or identical to approximately 1.6 μs.

During a third period P3, the first scan signal GW[i] of the i-th horizontal line may have a low level. In this case, the second sensor transistor M2 of the photo sensor PHS of the i-th horizontal line may be turned on, and the sensing signal RX corresponding to the voltage (e.g., the i-th gate voltage M1_gate[i]) on the fifth node N5 of the photo sensor PHS located on the i-th horizontal line may be outputted to the readout line (e.g., the k-th readout line RXk).

Subsequently, during a fourth period P4, the third control signal SHS may have a high level. In this case, the second sampling signal V_SHS described with reference to FIG. 8 may be generated. The fourth period P4 may be a period between the first scan signal GW[i] of the i−1-th horizontal line and the first scan signal GW[i+1] of the i+1-th horizontal line (or between periods during which the first scan signal GW[i] and the first scan signal GW[i+1] are applied). The fourth period P4 may be less than or identical to approximately 1.6 μs.

Referring to FIG. 14, a reference curve CURVE0 indicates an ideal range of a sensing value outputted from the analog-digital converter ADC (refer to FIG. 8). For example, in the case where the display device 1000 is operated in accordance with the embodiments of FIGS. 9 and 10, and in the case where one horizontal time 1H of FIG. 10 is greater than or identical to 12.8 μs, a sensing value (e.g., an output value ADC Code of the analog-digital converter ADC) according to a gate voltage Vg of the first sensor transistor M1 (refer to FIG. 5) may be expressed by the reference curve CURVE0. In the case where the reset voltage VRST is approximately −6 V, the sensing value (or the ideal sensing value) may be within a range of approximately 6000 or less, according to the gate voltage M1_gate[i] illustrated in FIG. 11. In the case where the second power voltage VSS is approximately −4.7 V, the sensing value (or the ideal sensing value) may be within a range of approximately 15000 or more.

A first curve CURVE1 indicates a range of a sensing value outputted from the analog-digital converter ADC in accordance with an embodiment of FIG. 12. According to the first curve CURVE1, the sensing value in accordance with the embodiment of FIG. 12 ranges from approximately 10000 to approximately 35000, and the range of the sensing value may be less than the range of the ideal sensing value.

In other words, even if the readout time increases to four horizontal times, in the case where the display device 1000 is operated in accordance with the embodiment of FIG. 12 similar to the embodiment of FIG. 10, the range of the sensing value may be narrow, and the sensitivity (or the sensing sensitivity) may be low. The first and second sampling operations are performed during the second and fourth periods P2 and P4 during which there is no overlap with the first scan signals GW[i−1], GW[i], and GW[i+1]. Here, for example, because the fourth period P4 is not sufficient, the range of the sensing value may be narrow.

Therefore, in the display device 1000 in accordance with embodiments of the present disclosure, the second sampling operation may be performed during the fourth period P4_1 (refer to FIG. 13) which is relatively large, whereby the sensitivity can be enhanced.

Referring to FIGS. 13 and 8, four horizontal times may be allocated to read out (e.g., sample) the sensing signal RX of the photo sensor PHS of the i-th horizontal line.

During a first period P1_1, the first scan signal GW[i−1] of the i−1-th horizontal line may have a low level (or a turn-on level). Furthermore, during the first period P1_1, which occurs after the fourth period P4_1, the first scan signal GW[i+1] of the i+1-th horizontal line and the first scan signal GW[i+2] of the i+2-th horizontal line each may have a low level (or a turn-on level). The first period P1_1 may correspond to approximately three horizontal times 3H.

Furthermore, during the first period P1_1, the first control signal RESET may have a high level (or a turn-on level ON). In this case, during the first period P1_1, the reset switch SW_RESET may be turned on, and the readout circuit 222 (or the capacitor C_F, or the integrating circuit) and the readout line may be initialized or reset.

During a period other than the first period P1_1, the first control signal RESET may have a low level (or a turn-off level). In this case, the integrating circuit may integrate the sensing signal RX and output the integrated sensing signal RX.

During a second period P2_1, the second control signal SHR may have a high level and the third control signal SHS may have a low level. In this case, the first sampling signal V_SHR described with reference to FIG. 8 may be generated. The second period P2_1 may be substantially the same as the second period P2 illustrated in FIG. 12.

During a third period P3_1, the first scan signal GW[i] of the i-th horizontal line may have a low level. In addition, during the third period P3_1, the third control signal SHS may have a high level. In this case, the second sensor transistor M2 of the photo sensor PHS of the i-th horizontal line may be turned on, and the sensing signal RX corresponding to the voltage (e.g., the i-th gate voltage M1_gate [i]) on the fifth node N5 of the photo sensor PHS located on the i-th horizontal line may be outputted to the readout line (e.g., the k-th readout line RXk).

During a fourth period P4_1, the third control signal SHS may have a high level. In this case, the second sampling signal V_SHS described with reference to FIG. 8 may be generated. The fourth period P4_1 may overlap the third period P3_1 or include the third period P3_1. The fourth period P4_1 may be a period between a time point at which the first scan signal GW[i] of the i−1-th horizontal line is applied and a time point at which the first scan signal GW[i+1] of the i+1-th horizontal line is applied. The fourth period P4_1 may be one horizontal time (e.g., approximately 3.2 μs).

Referring to FIG. 14, a second curve CURVE2 indicates a range of a sensing value outputted from the analog-digital converter ADC in accordance with an embodiment of FIG. 13. According to the second curve CURVE2, the range of the sensing value in accordance with the embodiment of FIG. 13 may be 60000 or less, and may be substantially the same as the range of the ideal sensing value according to the reference curve CURVE0.

In other words, as the size of the fourth period P4_1 for the second sampling operation increases, the sensitivity (or the sensing sensitivity) may be prevented from being reduced.

Figure 15:
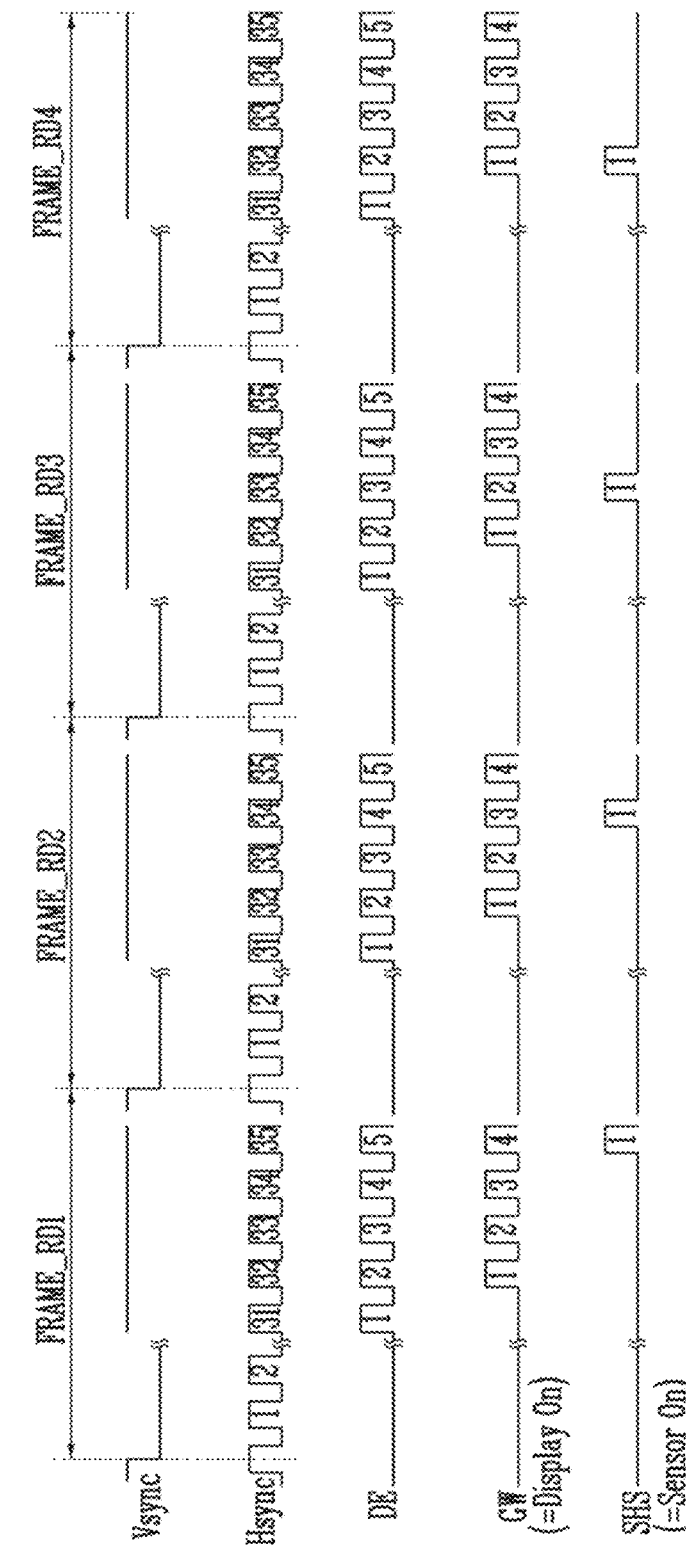
FIG. 15 is a waveform diagram for describing a method of driving the display device in accordance with an embodiment of the present disclosure.

FIG. 15 is a waveform diagram for describing a method of driving the display device in accordance with an embodiment of the present disclosure.

Referring to FIGS. 2, 5, 8, 11, 13, and 15, a vertical synchronization signal Vsync and a horizontal synchronization signal Hsync may be included in the control signal CS (refer to FIG. 2). The vertical synchronization signal Vsync may indicate frame data or a start (or a start point) of a frame period. The horizontal synchronization signal Hsync may indicate a data row or a horizontal line, or a start (or a start point) thereof. A display enable signal DE may be included in the data control signal DCS (refer to FIG. 2), and may be a signal indicating a point at which a data signal is inputted. The first scan signals GW may refer to first scan lines S11 to Sin. For convenience of explanation, the first scan signals GW corresponding to a plurality of horizontal lines are illustrated as a single waveform. For example, a first pulse of the first scan signals GW may refer to a first scan signal to be provided to the first scan signal S11 of the first horizontal line. An i-th pulse of the first scan signals GW may refer to a first scan signal to be provided to the i-th first scan signal S1i. For convenience of explanation, FIG. 15 illustrates only the third control signal SHS. Timings of the application of the first control signal RESET and the second control signal SHR may be determined based on the third control signal SHS, as described with reference to FIG. 13 or FIG. 12.

At a start time point of each of the first to fourth frame periods FRAME_RD1 to FRAME_RD4 (or the first to fourth readout frame periods), a pulse (or a low level pulse) of the vertical synchronization signal Vsync may be generated. In response to the vertical synchronization signal Vsync, pulses of the horizontal synchronization signal Hsync (e.g., high level pulses) may be generated on a cycle of one horizontal time. For example, 35 high level pulses of the horizontal synchronization signal Hsync are included in the first frame period FRAME_RD1, but the present disclosure is not limited thereto.

The display enable signal DE may have pulses (e.g., high level pulses) after a specific time (e.g., a preset time) has passed from a time point at which a pulse of the vertical synchronization signal Vsync is generated. For example, at a time point at which thirty horizontal times have passed from a time point at which the vertical synchronization signal Vsync is applied (for example, a time point at which a thirty-first pulse of the horizontal synchronization signal Hsync is generated), the display enable signal DE may have a first pulse.

In response to the display enable signal DE, the first scan signals GW may have pulses (e.g., high level pulses). A timing of application of the first scan signals GW may correspond to a timing of application of a display enable signal DE so that a data signal generated based on the display enable signal DE is written to the corresponding pixel PX (refer to FIG. 5). For example, from a time point which is delayed by one horizontal time compared to that of the display enable signal DE, the first scan signals GW may be sequentially provided to the first scan lines S11 to Sin. For example, the first scan signal (or the first pulse of each of the first scan signals GW) may be provided to the first scan line S11 of the first horizontal line in response to a second pulse of the display enable signal DE. The first scan signal (or a second pulse of each of the first scan signals GW) may be provided to the first scan line of the second horizontal line in response to a third pulse of the display enable signal DE. The first scan signal (or a third pulse of each of the first scan signals GW) may be provided to the first scan line of the second horizontal line in response to a fourth pulse of the display enable signal DE. The first scan signal (or a fourth pulse of each of the first scan signals GW) may be provided to the first scan line of the second horizontal line in response to a fifth pulse of the display enable signal DE. As the first scan signals GW are applied to the display panel 100, data signals may be written to the respective pixels PX, so that an image may be displayed on the display panel 100.

In certain embodiments, the third control signal SHS may be applied at different timings in the first to fourth frame periods FRAME_RD1 to FRAME_RD4. In other words, the timings of the application of the third control signal SHS having a high level in the first to fourth frame periods FRAME_RD1 to FRMAE_RD4 may differ from each other.

For example, as illustrated in FIG. 15, in the first frame period FRAME_RD1, the third control signal SHS may be applied in response to fourth pulses of the first scan signals GW (e.g., in response to the first scan signal of the fourth horizontal line). In this case, a sensing signal may be read out from the photo sensor PHS of the fourth horizontal line. In other words, in the first frame period FRAME_RD1, the third control signal SHS may be applied in response to 4x-th pulses of the first scan signals GW (e.g., the first scan signals of the 4x-th horizontal lines). In the first frame period FRAME_RD1, sensing signals corresponding to the 4x-th horizontal lines may be read out (e.g., sensor on).

Likewise, in the second frame period FRAME_RD2, the third control signal SHS may be applied in response to third pulses of the first scan signals GW (or in response to the first scan signals of the 4(x−1)+3-th horizontal lines). In the third frame period FRAME_RD3, the third control signal SHS may be applied in response to second pulses of the first scan signals GW (or in response to the first scan signals of the 4(x−1)+2-th horizontal lines). In the fourth frame period FRAME_RD4, the third control signal SHS may be applied in response to first pulses of the first scan signals GW (or in response to the first scan signals of the 4(x−1)+1-th horizontal lines).

As described above, in a plurality of frame periods (e.g., the first to fourth frame periods FRAME_RD1 to FRAME_RD4) for readout, the timing of the application of the third control signal SHS may be changed, and the display device 1000 may perform a readout operation in a time-sharing scheme.

Figure 16:
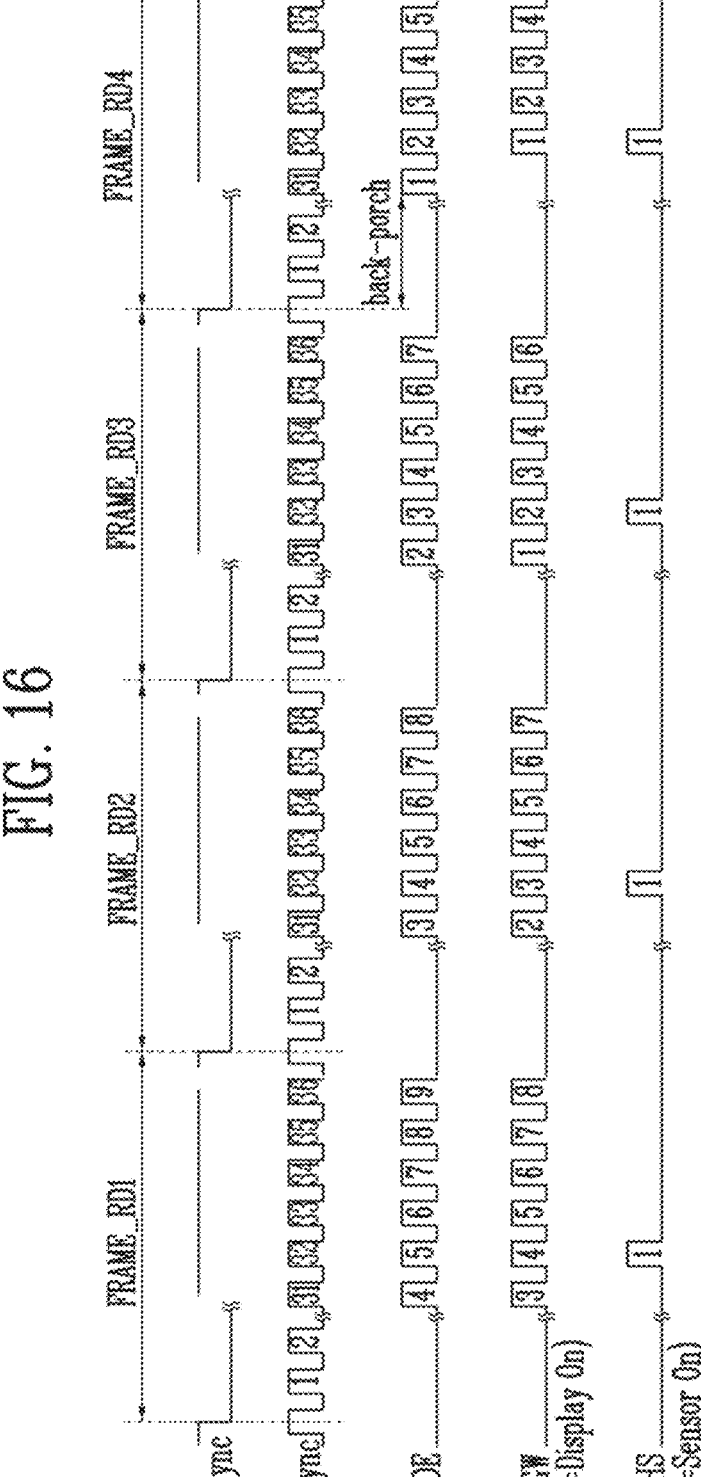
FIG. 16 is a waveform diagram for describing a method of driving the display device in accordance with an embodiment of the present disclosure.

FIG. 16 is a waveform diagram for describing a method of driving the display device in accordance with an embodiment of the present disclosure.

Referring to FIGS. 2, 5, 8, 11, 13, 15, and 16, the third control signal SHS may be applied at a certain time point based on the vertical synchronization signal Vsync.

For example, as illustrated in FIG. 16, in each of the first to fourth frame periods FRAME_RD1 to FRMAE_RD4, the pulse of the third control signal SHS may be generated in response to a thirty-second pulse and a thirty-sixth pulse of the horizontal synchronization signal Hsync.

In certain embodiments, the display enable signal DE and/or the first scan signals GW may be applied at different timings in the first to fourth frame periods FRAME_RD1 to FRAME_RD4.

For example, as illustrated in FIG. 16, in the first frame period FRAME_RD1, a fourth pulse of the display enable signal DE may be generated in response to a thirty-first pulse of the horizontal synchronization signal Hsync, and fourth pulses of the first scan signals GW (e.g., the first scan signals of the fourth horizontal lines) may be generated in response to a thirty-second pulse of the horizontal synchronization signal Hsync. In this case, in the first frame period FRAME_RD1, a sensing signal corresponding to the fourth horizontal line (or the 4x-th horizontal lines) may be read out.

Likewise, in the second frame period FRAME_RD2, a third pulse of the display enable signal DE may be generated in response to the thirty-first pulse of the horizontal synchronization signal Hsync, and third pulses of the first scan signals GW (e.g., the first scan signals of the third horizontal lines) may be generated in response to a thirty-second pulse of the horizontal synchronization signal Hsync. In this case, in the second frame period FRAME_RD2, a sensing signal corresponding to the third horizontal line (or the 4(x−1)+3-th horizontal lines) may be read out.

In the third frame period FRAME_RD3, a second pulse of the display enable signal DE may be generated in response to the thirty-first pulse of the horizontal synchronization signal Hsync, and second pulses of the first scan signals GW (e.g., the first scan signals of the second horizontal lines) may be generated in response to a thirty-second pulse of the horizontal synchronization signal Hsync. In this case, in the third frame period FRAME_RD3, a sensing signal corresponding to the second horizontal line (or the 4(x−1)+2-th horizontal lines) may be read out.

In the fourth frame period FRAME_RD4, a first pulse of the display enable signal DE may be generated in response to the thirty-first pulse of the horizontal synchronization signal Hsync, and first pulses of the first scan signals GW (e.g., the first scan signals of the first horizontal lines) may be generated in response to a thirty-second pulse of the horizontal synchronization signal Hsync. In this case, in the fourth frame period FRAME_RD4, a sensing signal corresponding to the first horizontal line (or the 4(x−1)+1-th horizontal lines) may be read out.

As described above, in a plurality of frame periods (e.g., the first to fourth frame periods FRAME_RD1 to FRAME_RD4) for readout, the timing of the application of the third control signal SHS may be fixed, and instead, the timing of the application of the display enable signal DE may vary. In the case where a period from a time point at which the vertical synchronization signal Vsync is applied to a time point before the display enable signal DE (or a first pulse thereof) is applied is referred to as a back-porch period of the vertical synchronization signal Vsync, the width of the back-porch period may vary in the first to fourth frame periods FRAME_RD1 to FRAME_RD4.

Figure 18:
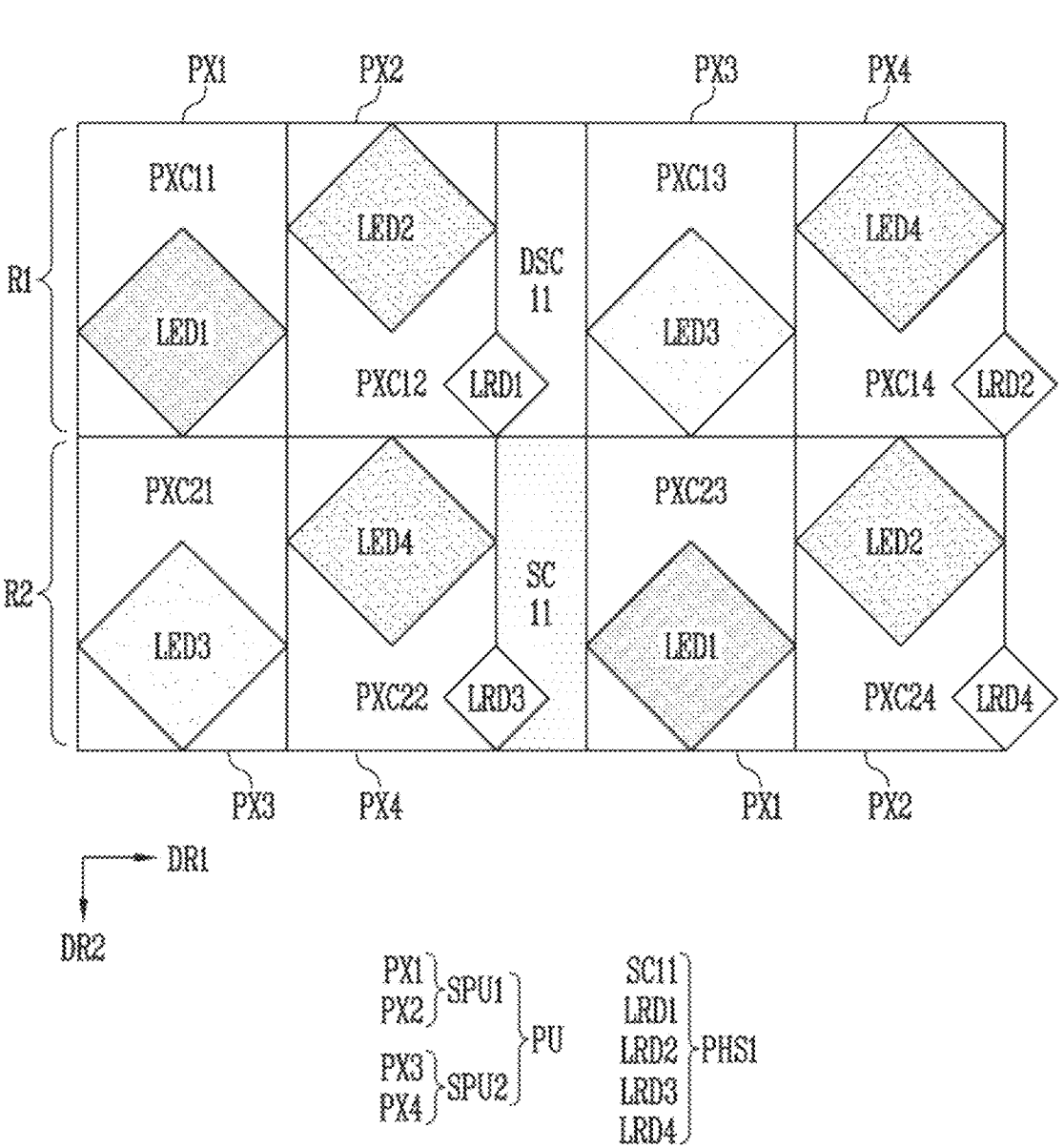
FIG. 18 is a diagram illustrating an example of the display area of the display panel included in the display device of FIG. 2.

FIG. 17 is a diagram illustrating an example arrangement of backplane circuits of the display area of the display panel included in the display device of FIG. 2. FIG. 18 is a diagram illustrating an example of the display area of the display panel included in the display device of FIG. 2.

Referring to FIGS. 1 to 4, 17, and 18, the configuration of the embodiments of FIGS. 17 and 18, other than sensor circuits SC11 to SC22 and dummy sensor circuits DSC11 to DSC22, is substantially identical or similar to that of the embodiments of FIGS. 2 and 3; therefore, a repetitive explanation thereof will be omitted.

The sensor circuits SC11 to SC22 may be disposed by a plurality of pixel rows (or a plurality of horizontal lines) and by at least one pixel unit PU.

In an embodiment, the sensor circuits SC11, SC12, SC21, and SC22 may be disposed on the second pixel row R2 and the fourth pixel row R4. Each of the sensor circuits SC11, SC12, SC21, and SC22 may be connected to at least four light receiving elements. For example, the first sensor circuit SC11 of the second pixel row R2 may be connected in common to the first to fourth light receiving elements LRD1 to LRD4. In other words, a detection current (or a detection voltage, a sensing signal) generated from the first to fourth light receiving elements LRD1 to LRD4 may be detected by the single first sensor circuit SC11. In other words, the first photo sensor PHS may include first to fourth light receiving elements LRD1 to LRD4 and one sensor circuit (e.g., SC11).

The first sensor circuit SC11 of the second pixel row R2 may be disposed between the first sub-pixel unit SPU1 and the second sub-pixel unit SPU2 which are included in the pixel unit PU. For example, the first and second pixel circuits PXC21 and PXC22 of the second pixel row R2 may be included in the second sub-pixel unit SPU2. The third and fourth pixel circuits PXC23 and PXC24 of the second pixel row R2 may be included in the first sub-pixel unit SPU1. Therefore, at least four pixel circuits (e.g., PXC23, PXC24, PXC25, and PXC26) may be disposed between the first sensor circuit SC11 and the second sensor circuit SC12 which are adjacent to each other on the second pixel row R2.

The first sensor circuit SC11 of the second pixel row R2 may be disposed between the second pixel circuit PXC22 of the second pixel row R2 and the third pixel circuit PXC23 of the second pixel row R2. Likewise, the second sensor circuit SC22 of the second pixel row R2 may be disposed between the sixth pixel circuit PXC26 of the second pixel row R2 and the seventh pixel circuit PXC27 of the second pixel row R2.

The first sensor circuit SC21 of the fourth pixel row R4 may be disposed between the second pixel circuit PXC42 of the fourth pixel row R4 and the third pixel circuit PXC43 of the fourth pixel row R4. Likewise, the second sensor circuit SC22 of the fourth pixel row R4 may be disposed between the sixth pixel circuit PXC46 of the fourth pixel row R4 and the seventh pixel circuit PXC47 of the fourth pixel row R4.

Because a pixel and a photo sensor are integrated together in the display area AA of the display panel 100 in accordance with an embodiment of FIGS. 2 and 3, a light-emitting surface area may be reduced, and a light-receiving surface area of the photo sensor may be insufficient. Therefore, in the display device 1000 in accordance with an embodiment of FIGS. 17 and 18, the first photo sensor PHS1 may perform a sensing operation based on light provided to the first to fourth light receiving elements LRD1 to LRD4, so that the number of sensor circuits can be reduced, and a reduction in resolution of the display area AA can be minimized. Furthermore, because a current generated from the first to fourth light receiving elements LRD1 to LRD4 is provided to one sensor circuit (e.g., SC11), a light receiving amount of the photo sensor may be increased, and the light sensing performance thereof can be improved.

In the case where only the sensor circuits SC11, SC12, SC21, and SC22 are disposed in the display area AA, unnecessary extra space (AS of FIG. 17) may be formed by removing the existing sensor circuits. For example, in the extra space AS of the first pixel row R1, the scan lines and the emission control lines that are provided to drive the first pixel row R1 may extend in the first direction DR1, and in the second pixel row R2, the scan lines and the emission control lines that are provided to drive the second pixel row R2 may overlap the first sensor circuit SC11. Due to a difference in layout between the extra space AS and the area where the first sensor circuit SC11 is disposed, there may be a difference (e.g., a difference in resistive-capacitive (RC) load) between a capacitance formed on the scan line of the first pixel row R1 and a capacitance formed on the scan line of the second pixel row R2. Such a difference in capacitance may lead to an image quality defect such as when a horizontal line is visible.

In the case where the first sensor circuit SC11 extends to the extra space AS to prevent a horizontal line from being visible, the number of lines (e.g., various scan lines extending in the first direction DR1) that overlap the first sensor circuit SC11 may be increased, so that an influence of coupling on the first sensor circuit SC11 may be increased. Such an increase in the influence of coupling may cause deterioration in performance of the photo sensor.

To prevent the above-mentioned issues, dummy sensor circuits DSC11, DSC12, DSC21, and DSC22 may be disposed in the extra space AS. In an embodiment, the dummy sensor circuits DSC11, DSC12, DSC21, and DSC22 may be disposed on the first pixel row R1 and the third pixel row R3. However, the dummy sensor circuits DSC11, DSC12, DSC21, and DSC22 may not be connected to the light receiving elements LRD1 to LRD4. For example, the dummy sensor circuits DSC11, DSC12, DSC21, and DSC22 may not perform a light sensing operation. Hence, the issues associated with a horizontal line being visible and the performance of the photo sensor being degraded can be mitigated.

The first dummy sensor circuit DSC11 of the first pixel row R1 may be disposed between the first sub-pixel unit SPU1 and the second sub-pixel unit SPU2 included in the pixel unit PU. For example, the first and second pixel circuits PXC11 and PXC12 of the first pixel row R1 may be included in the first sub-pixel unit SPU1. The third and fourth pixel circuits PXC13 and PXC14 of the first pixel row R1 may be included in the second sub-pixel unit SPU2.

Therefore, at least four pixel circuits (e.g., PXC13, PXC14, PXC15, and PXC16) may be disposed between the first dummy sensor circuit DSC11 and the second dummy sensor circuit DSC12 which are adjacent to each other on the first pixel row R1.

The first dummy sensor circuit DSC11 of the first pixel row R1 may be disposed between the second pixel circuit PXC12 of the first pixel row R1 and the third pixel circuit PXC13 of the first pixel row R1. Likewise, the second dummy sensor circuit DSC12 of the first pixel row R1 may be disposed between the sixth pixel circuit PXC16 of the first pixel row R1 and the seventh pixel circuit PXC17 of the first pixel row R1.

The first dummy sensor circuit DSC21 of the third pixel row R3 may be disposed between the second pixel circuit PXC32 of the third pixel row R3 and the third pixel circuit PXC33 of the third pixel row R3. Likewise, the second dummy sensor circuit DSC22 of the third pixel row R3 may be disposed between the sixth pixel circuit PXC36 of the third pixel row R3 and the seventh pixel circuit PXC37 of the third pixel row R3.

In an embodiment, the sensor circuits SC11, SC12, SC21, and SC22 and the dummy sensor circuits DSC11, DSC12, DSC21, and DSC22 may be similar to each other in layout. Therefore, a difference in capacitance between the scan lines of adjacent pixel rows may be minimized, so that the visibility of the horizontal line may be mitigated.

In an embodiment, the dummy sensor circuits DSC11 to DSC22 and the sensor circuits SC11 to SC22 may not be disposed between the pixel units PU that are adjacent to each other. For example, neither the dummy sensor circuits nor the sensor circuits are disposed between the respective fourth pixel circuits PXC14, PXC24, PXC34, and PXC44 of the pixel rows R1 to R4 and the respective fifth pixel circuits PXC15, PXC25, PXC35, and PXC45 of the pixel rows R1 to R4.

Figure 19:
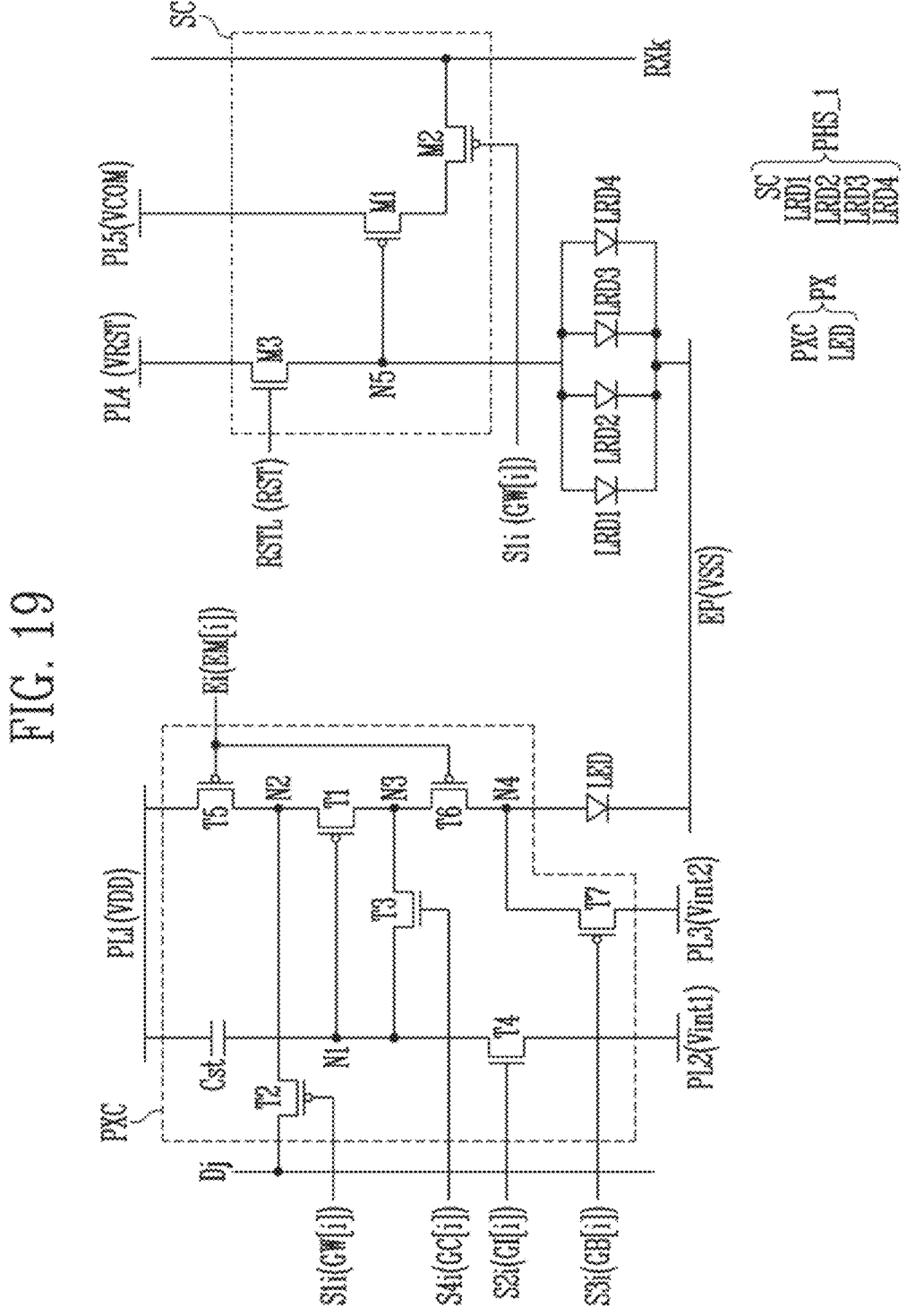
FIG. 19 is a circuit diagram illustrating an example of the pixel and the photo sensor which are included in the display area of FIG. 18.

FIG. 19 is a circuit diagram illustrating an example of the pixel PX and the photo sensor PHS which are included in the display area AA of FIG. 18.

Referring to FIGS. 1 to 5, and 17 to 19, a pixel PX and a photo sensor PHS_1 in accordance with an embodiment of FIG. 19 other than a plurality of light receiving elements (e.g., first to fourth light receiving elements LRD1 to LRD4) may be substantially identical or similar to the pixel circuit PX and the photo sensor PHS that are illustrated in FIG. 5. Therefore, a repetitive explanation thereof will be omitted.

In an embodiment, the first to fourth light receiving elements LRD1 to LRD4 may be connected in parallel between the fifth node N5 and the electrode EP to which the second power voltage VSS is to be provided. Therefore, if the third sensor transistor M3 is turned off by a reset signal RST supplied to the reset control line RSTL, the voltage of the fifth node N5 may be changed by light that is incident on the first to fourth light receiving elements LRD1 to LRD4. If the second sensor transistor M2 is turned on by the first scan signal GW[i], a detection value (e.g., a current and/or voltage) generated based on the voltage of the fifth node N5 may flow to the readout line RXk.

The sensor circuit SC and the first to fourth light receiving elements LRD1 to LRD4 connected thereto may form a photo sensor PHS_1. Therefore, the light receiving amount and the light sensing performance of the photo sensor PHS_1 may be enhanced.

Figure 20:
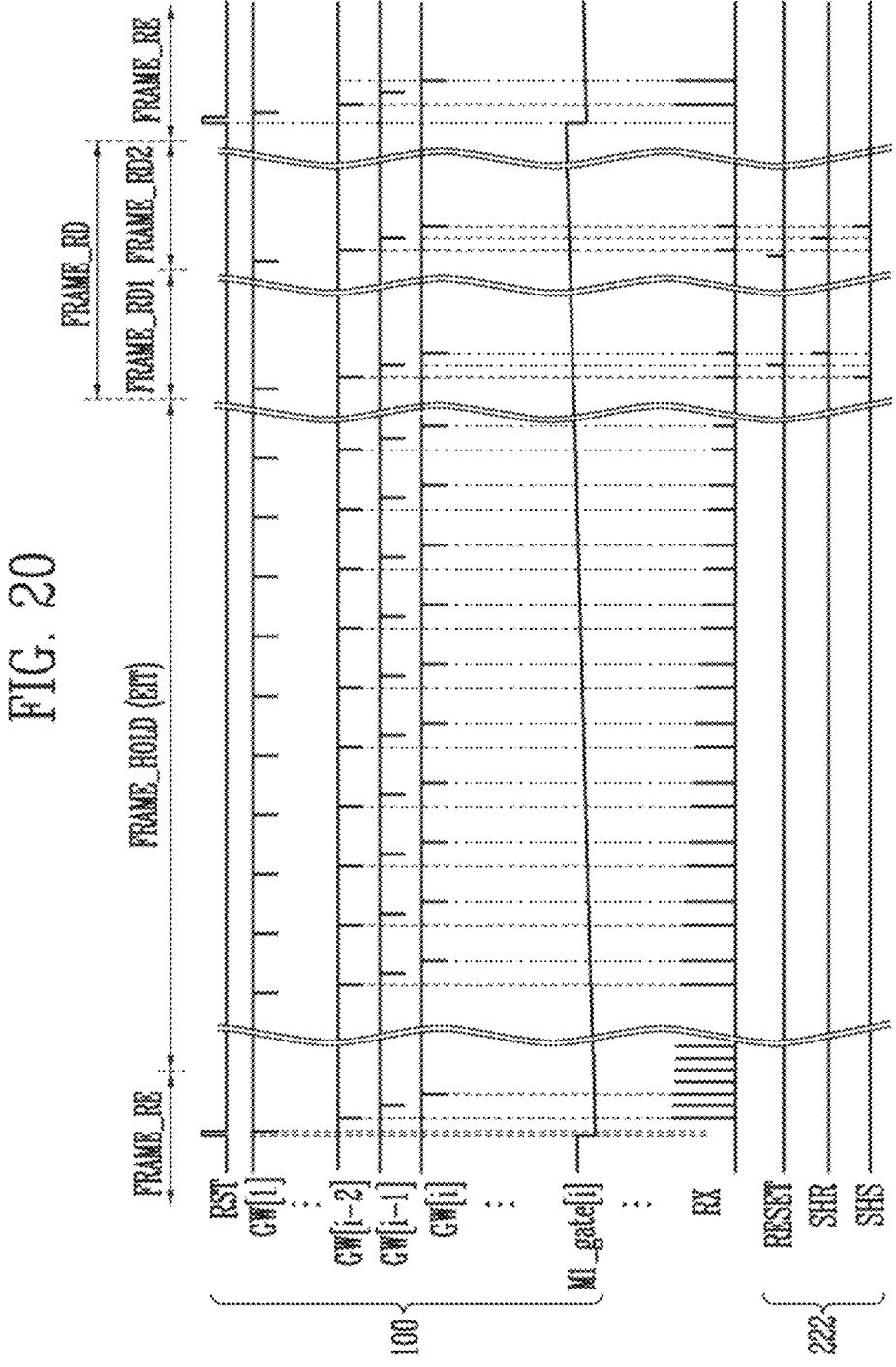
FIG. 20 is a view for describing an embodiment of the operation of the display device of FIG. 2.
Figure 21:
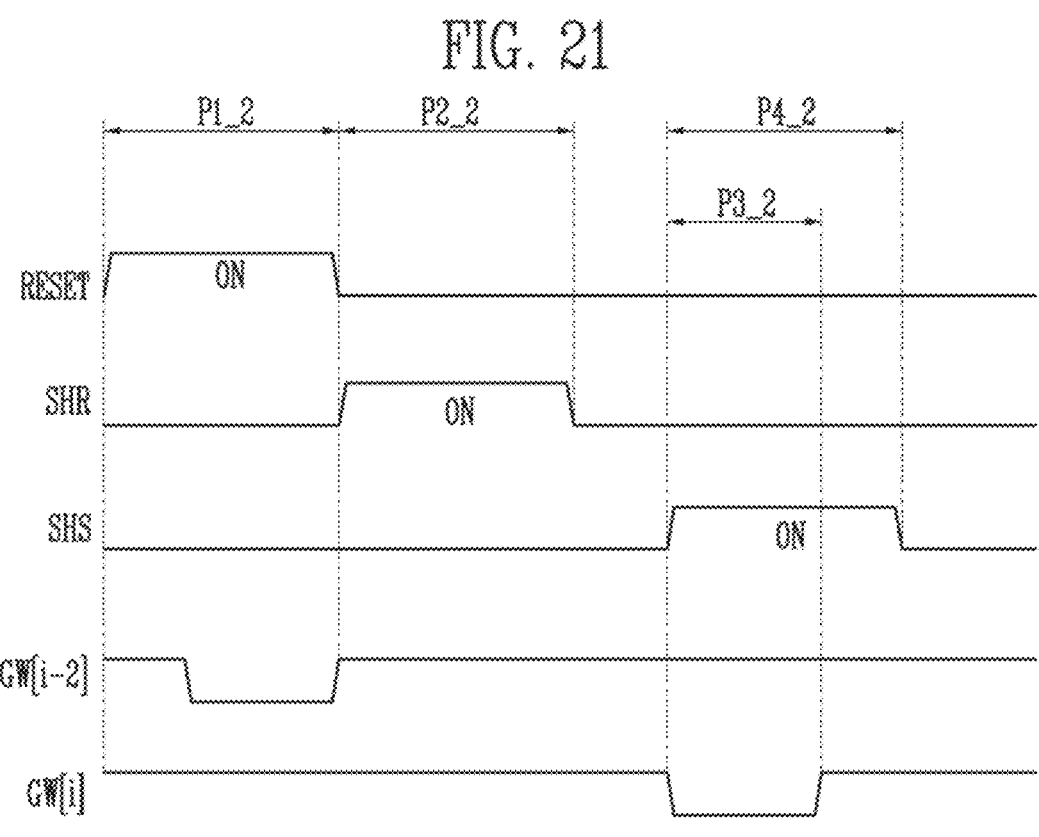
FIG. 21 is a view for describing an embodiment of the operation of the readout circuit of FIG. 8.
Figure 22:
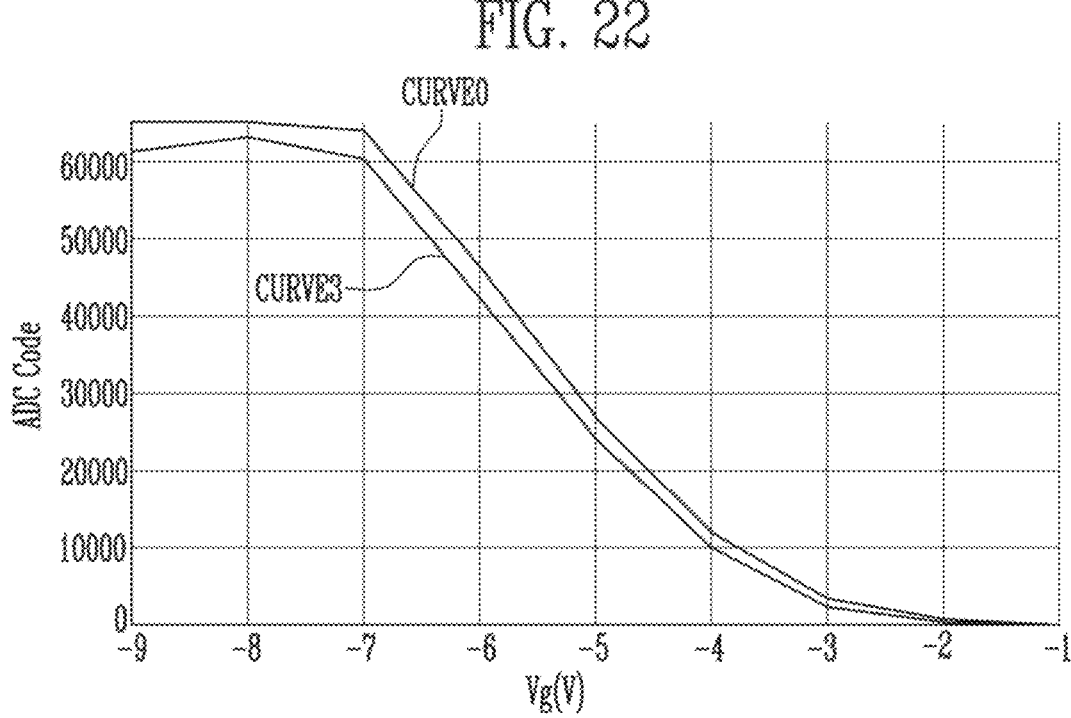
FIG. 22 is a view illustrating a sensing value in accordance with an embodiment of FIG. 21.

FIG. 20 is a diagram for describing an embodiment of the operation of the display device of FIG. 2. The embodiment in accordance with FIG. 20 may refer to the operation of the display device 1000 to which an embodiment of FIGS. 17 to 19 is applied. FIG. 21 is a diagram for describing an embodiment of the operation of the readout circuit 222 of FIG. 8. FIG. 21 illustrates the operation of the readout circuit 222 included in the display device 1000 to which an embodiment of FIGS. 17 to 19 is applied. FIG. 22 is a diagram illustrating a sensing value in accordance with an embodiment of FIG. 21.

Referring to FIGS. 2, 5, 7 to 9, and 17 to 20, the operation of the display device 1000 during the reset frame period FRAME_RE and the hold frame period FRAME_HOLD may be substantially the same as the operation of the display device 1000 in accordance with the comparative embodiment of FIG. 9. Therefore, a repetitive explanation thereof will be omitted.

An i–2-th first scan signal GW[i–2] may be provided to the first scan line of the i–2-th horizontal line (or the i–2-th pixel row). An i–1-th scan signal GW[i–1] may be provided to the first scan line of the i–1-th horizontal line (or the i–1-th pixel row). An i-th scan signal GW[i] may be provided to the first scan line S1i of the i-th horizontal line (or the i-th pixel row).

The readout frame period FRAME_RD may include a plurality of frame periods. For example, the readout frame period FRAME_RD may include a first frame period FRAME_RD1 and a second frame period FRAME_RD2 (or first and second readout frame periods).

During each of the first and second frame periods FRAME_RD1 and FRAME_RD2, each of the first control signal RESET, the second control signal SHR, and the third control signal SHS may have a high level (or a turn-on level at which the switch is turned on) on a cycle of four horizontal times. In this case, during each of the first and second frame periods FRAME_RD1 and FRAME_RD2, sensing signals RX of half of all photo sensors PHS_1 provided in the display panel 100 (or all photo sensors PHS_1 connected to the k-th readout line RXk) may be read out or sampled.

For example, based on the third control signal SHS having a high level, the sensing signal RX for the photo sensor PHS_1 of the i–2-th horizontal line to which the first scan signal GW[i–2] is to be applied may be read out during the first frame period FRAME_RD1. Likewise, based on the third control signal SHS having a high level, the sensing signal RX for the photo sensor PHS_1 of the i-th horizontal line to which the first scan signal GW[i] is to be applied may be read out during the second frame period FRAME_RD2. For example, referring to FIGS. 17 and 18, the sensing signal RX for the photo sensor PHS_1 (or the sensor circuit) of the 4(x–1)+2-th horizontal line may be read out during the first frame period FRAME_RD1, and the sensing signal RX for the photo sensor PHS_1 (or the sensor circuit) of the 4x-th horizontal line may be read out during the second frame period FRAME_RD2.

Referring to FIGS. 21 and 8, four horizontal times may be allocated to read out (e.g., sample) the sensing signal RX of the photo sensor PHS_1 of the i-th horizontal line.

During a first period P1_2, the first scan signal GW[i–2] of the i–2-th horizontal line may have a low level (or a turn-on level). The first period P1_2 may correspond to approximately one horizontal times 1H (or approximately 3.2 μs).

Furthermore, during the first period P1_2, the first control signal RESET may have a high level (or a turn-on level ON). In this case, during the first period P1_2, the reset switch SW_RESET may be turned on, and the readout circuit 222 (or the capacitor C_F, or the integrating circuit) and the readout line may be initialized or reset.

During a period other than the first period P1_2, the first control signal RESET may have a low level (or a turn-off level). In this case, the integrating circuit may integrate the sensing signal RX and output the integrated sensing signal RX.

During a second period P2_2, the second control signal SHR may have a high level and the third control signal SHS may have a low level. In this case, the first sampling signal V_SHR described with reference to FIG. 8 may be generated. The second period P2_2 may correspond to approximately one horizontal time 1H.

During a third period P3_2, the first scan signal GW[i] of the i-th horizontal line may have a low level. In this case, the second sensor transistor M2 of the i-th photo sensor PHS_1 of the i-th horizontal line may be turned on, and the sensing signal RX corresponding to the voltage (e.g., the i-th gate voltage M1_gate[i]) on the fifth node N5 of the photo sensor PHS_1 located on the i-th horizontal line may be outputted to the readout line (e.g., the k-th readout line RXk).

During a fourth period P4_2, the third control signal SHS may have a high level and the second control signal SHR may have a low level. In this case, the second sampling signal V_SHS described with reference to FIG. 8 may be generated. The fourth period P4_2 may overlap the third period P3_2 or include the third period P3_2. The fourth period P4_2 may be approximately one horizontal time (e.g., approximately 3.2 μs) from a time point at which the first scan signal GW[i] of the i-th horizontal line is applied.

Referring to FIG. 22, a third curve CURVE3 indicates a range of a sensing value outputted from the analog-digital converter ADC in accordance with an embodiment of FIG. 21. According to the third curve CURVE3, the range of the sensing value in accordance with the embodiment of FIG. 21 may be 60000 or less, and may be substantially the same as the range of the ideal sensing value according to the reference curve CURVE0. In other words, the sensitivity (or the sensing sensitivity) may not be reduced.

In a display device in accordance with embodiments of the present disclosure, a plurality of horizontal times may be allocated as a readout time to read out (or sample) a sensing signal of a photo sensor of a single horizontal line. Sensing signals of only some of photo sensors in a display panel may be selectively read out during a single frame period. Sensing signals for all of the photo sensors in the display panel may be obtained during a plurality of frame periods. In other words, the display device may perform a readout operation in a time-sharing scheme during a plurality of frame periods. Because a sufficient readout time can be secured, the sensing sensitivity may be prevented being reduced.

The effects of the present disclosure are not limited by the foregoing, and other various effects are anticipated herein.

While the spirit and scope of the present disclosure are described by detailed embodiments, it should be noted that the above-described embodiments are merely descriptive and should not be considered limiting. It should be understood by those skilled in the art that various changes, substitutions, and alternations may be made herein without departing from the scope of the disclosure as set forth by the following claims.

What is claimed is:

1. A display device, comprising:
a plurality of pixels;
a plurality of photo sensors;
a scan driver configured to provide scan signals to the plurality of photo sensors and the plurality of pixels through scan lines; and
a readout circuit configured to receive detection signals which are outputted from the plurality of photo sensors in response to the scan signals through readout lines, wherein
the readout circuit receives the detection signals from all of the plurality of photo sensors during a plurality of frame periods, and
in each frame period of the plurality of frame periods, the plurality of pixels receive data signals and some of the plurality of photo sensors output the detection signals.

2. The display device according to claim 1, wherein each of the plurality of photo sensors includes a sensor circuit and a light receiving element.

3. The display device according to claim 2, wherein the sensor circuit and the light receiving element of each of the plurality of photo sensors are arranged in a first direction.

4. The display device according to claim 3, wherein the sensor circuit includes a sensor transistor providing a detection signal to a readout line to which the sensor circuit is connected when turned on by a first scan signal among the scan signals.

5. The display device according to claim 4, wherein in each of the plurality of frame periods, the readout circuit receives detection signals from as many photo sensors as a number obtained by dividing a number of all the plurality of photo sensors in the display device by a number of the plurality of frame periods.

6. The display device according to claim 5, wherein the readout circuit receives a detection signal from a first photo sensor during a first frame period, and receives a detection signal from a second photo sensor during a second frame period,
wherein the plurality of photo sensors comprise the first photo sensor connected to a first scan line and the readout line, and the second photo sensor connected to a second scan line and the readout line, and
wherein the first scan line and the second scan line are adjacent to each other.

7. The display device according to claim 6, wherein the readout circuit comprises:
an integrating circuit configured to integrate a signal flowing through the readout lines;
a first sampling circuit configured to sample an output of the integrating circuit and generate a first sampling signal;
a second sampling circuit configured to sample the output of the integrating circuit and generate a second sampling signal; and
an analog-digital converter configured to output a digital value corresponding to a difference between the first sampling signal and the second sampling signal.

8. The display device according to claim 7, wherein, during a first period in which a scan signal is applied to the first scan line, the integrating circuit and the readout line are reset,
wherein, in a second period, the first sampling circuit generates the first sampling signal, and
wherein, in the third period, a scan signal is applied to the second scan line and the second sampling circuit generates the second sampling signal.

9. The display device according to claim 8, wherein the third period is greater than the second period, and the first period is greater than the third period.

10. The display device according to claim 9, wherein the second sampling circuit generates the second sampling signal in response to a sampling control signal, and a pulse width of the sampling control signal is greater than a pulse width of the scan signal applied to the first scan line.

11. The display device according to claim 10, wherein the integrating circuit and the readout lines remain reset while scan signals are applied to at least two scan lines among the scan lines.

12. The display device according to claim 1, wherein the readout circuit samples the detection signals during the plurality of frame periods, and
wherein with respect to a vertical synchronization signal defining a start of each of the frame periods, a time point at which the sampling is first performed is changed in each of the frame periods.

13. The display device according to claim 1, wherein the readout circuit samples the detection signals during the plurality of frame periods, and
wherein with respect to a vertical synchronization signal defining a start of each of the frame periods, a time point at which the sampling is performed is identical in the frame periods, and a time point at which a first scan signal among the scan signals is applied is changed in each of the frame periods.

14. The display device according to claim 1, wherein the readout circuit receives the detection signals for less than all of the plurality of photo sensors during any one of the plurality of frame periods.

15. The display device according to claim 1, wherein each of the plurality of frame periods corresponds to a time in which only some of the plurality of photo sensors transmit a detection signal to the readout circuit.

16. The display device according to claim 1, wherein scan driver provides the scan signals only once to the plurality of photo sensors during each of the plurality of frame periods.

17. The display device according to claim 1, wherein each of the plurality of frame periods is an amount of time used to render a single still image in a sequence of images displayed on the display device.

18. The display device according to claim 1, wherein a detection signal is output from one of the plurality of photo sensors only when a control signal for the photo sensor is active simultaneous to the photo sensor being selected by one of the scan signals.

19. The display device according to claim 18, wherein a timing of the control signal varies between ones of the plurality of frame periods.

20. An electronic device comprising:

a processor configured to provide image data and a control signal; and a display device configured to display images based on the image data and the control signal, wherein the display device comprises:

a plurality of pixels;

a plurality of photo sensors;

a scan driver configured to provide scan signals to the plurality of photo sensors and the plurality of pixels through scan lines; and a readout circuit configured to receive detection signals which are outputted from the plurality of photo sensors in response to the scan signals through readout lines, wherein the readout circuit receives the detection signals from all of the plurality of photo sensors during each of a plurality of frame periods, and in each frame period of the plurality of frame periods, the plurality of pixels receive data signals and some of the plurality of photo sensors output the detection signals.

* * * * *